(12) United States Patent
Endert et al.

(10) Patent No.: US 10,017,645 B2
(45) Date of Patent: Jul. 10, 2018

(54) METAL AZO PIGMENTS

(71) Applicant: LANXESS Deutschland GmbH, Cologne (DE)

(72) Inventors: Sabine Endert, Wuppertal (DE); Frank Linke, Cologne (DE); Hans-Ulrich Borst, Elsdorf (DE)

(73) Assignee: LANXESS Deutschland GmbH, Cologne (DE)

( * ) Notice: Subject to any disclaimer, the term of this patent is extended or adjusted under 35 U.S.C. 154(b) by 0 days.

(21) Appl. No.: 15/463,284

(22) Filed: Mar. 20, 2017

(65) Prior Publication Data
US 2017/0275466 A1 Sep. 28, 2017

(30) Foreign Application Priority Data

Mar. 23, 2016 (EP) ..................................... 16161849

(51) Int. Cl.
| | | |
|---|---|---|
| *C09B 45/22* | (2006.01) | |
| *B41M 5/00* | (2006.01) | |
| *C08K 5/00* | (2006.01) | |
| *C09B 29/52* | (2006.01) | |
| *C09D 5/02* | (2006.01) | |
| *C09D 11/037* | (2014.01) | |
| *C09D 11/322* | (2014.01) | |
| *C09D 17/00* | (2006.01) | |
| *G02B 5/22* | (2006.01) | |
| *G03F 7/00* | (2006.01) | |
| *G03F 7/004* | (2006.01) | |
| *G03F 7/028* | (2006.01) | |
| *G03F 7/16* | (2006.01) | |
| *G03F 7/20* | (2006.01) | |
| *G03F 7/32* | (2006.01) | |
| *C09B 45/18* | (2006.01) | |
| *C09B 67/04* | (2006.01) | |
| *C09B 67/48* | (2006.01) | |
| *C09B 67/22* | (2006.01) | |
| *C09D 7/41* | (2018.01) | |
| *G03F 7/105* | (2006.01) | |

(52) U.S. Cl.
CPC ........... *C09B 45/22* (2013.01); *B41M 5/0023* (2013.01); *C08K 5/0091* (2013.01); *C09B 29/3665* (2013.01); *C09B 45/18* (2013.01); *C09B 67/0002* (2013.01); *C09B 67/0029* (2013.01); *C09B 67/0051* (2013.01); *C09D 5/028* (2013.01); *C09D 7/41* (2018.01); *C09D 11/037* (2013.01); *C09D 11/322* (2013.01); *C09D 17/003* (2013.01); *G02B 5/223* (2013.01); *G03F 7/0007* (2013.01); *G03F 7/0042* (2013.01); *G03F 7/028* (2013.01); *G03F 7/105* (2013.01); *G03F 7/16* (2013.01); *G03F 7/2004* (2013.01); *G03F 7/32* (2013.01)

(58) Field of Classification Search
CPC ......... C09B 45/14; C09B 45/16; C09B 45/18; C09B 45/20; C09B 45/22; C09B 29/3665; C09B 67/0051; C08K 5/0091; G02B 5/223; G02F 1/133514; G02F 1/133516; G03F 7/0007; G03F 7/029; G03F 7/105; C09D 11/037; C09D 17/003
USPC ....................... 430/7; 349/106; 534/602, 707
See application file for complete search history.

(56) References Cited

U.S. PATENT DOCUMENTS

| | | |
|---|---|---|
| 6,245,138 B1 | 6/2001 | Nyssen et al. |
| 6,350,307 B1 | 2/2002 | Linke et al. |
| 7,255,737 B2 | 8/2007 | Feldhues et al. |
| 8,932,786 B2 | 1/2015 | Borst et al. |
| 2002/0034696 A1* | 3/2002 | Wolf ........................ C09B 45/14 430/7 |

FOREIGN PATENT DOCUMENTS

| | | |
|---|---|---|
| DE | 19535246 A1 | 3/1997 |
| JP | 11217514 A2 | 8/1999 |

OTHER PUBLICATIONS

Herbst, Willy, et al., Industrial Organic Pigments, 2004, Wiley-VCH, pp. 390-397.
Zorll, Ulrich, Rompp Lexikon, Lacke and Druckfarben, Photoinitiatoren, Georg Thieme Verlag, 1998, pp. 491-492.
Zorll, Ulrich, Rompp Lexikon, Lacke and Druckfarben, Recycling, Georg Thieme Verlag, 1998, pp. 445-446.
European Search Report from European Application No. 17161607, dated Jun. 29, 2017, two pages.

* cited by examiner

*Primary Examiner* — John A McPherson

(57) ABSTRACT

The novel yellow metal azo pigments based on at least three metal azo compounds which differ at least in the type of metal have improved color strengths and are of excellent suitability for pigmentation of pigment preparations for a broad field of use.

18 Claims, No Drawings

METAL AZO PIGMENTS

The present invention relates to novel yellow metal azo pigments based on at least three metal azo compounds which differ at least in the type of metal, to processes for production thereof and to the use thereof as yellow pigment in pigment preparations.

BACKGROUND INFORMATION

The preparation of metal complexes from azobarbituric acid with nickel salts and the use thereof as yellow pigments has long been known and has been described many times in the literature (cf., for example, W. Herbst, K. Hunger: Industrial Organic Pigments, 3rd edition 2004, p. 390/397). It is additionally known that these products can be reacted further, for example with melamine or melamine derivatives, in order to improve the performance properties of the pigments, for example in the colouring of plastics, lacquers and colour filters for LCDs.

In addition, the literature states that colouristic properties can also be adjusted using, apart from nickel salts, one or more salts of different metals as well. The application EP-A 1 591 489 describes metal, complexes of azo compounds containing, as metals, those from the group of the alkali metals, alkaline earth metals, the lanthanoids, and aluminium, scandium, titanium, vanadium, chromium, manganese, cobalt, copper, nickel and zinc, and optionally iron. The pigments obtained have a different colour locus compared to the pure nickel-azobarbituric acid complexes.

Controlled surface coverage of the metal azo pigment can likewise achieve an improvement in performance-based properties, specifically the lowering of the dispersion hardness as a measure of the dispersion properties of the pigment. However, this method of improving dispersibility is associated with a reduction in the colour intensity of the pigment, which is directly dependent on the concentration of covering agent.

A further means of adjusting performance-based properties is to subject the pigments produced from nickel-azobarbituric acid complexes with melamine, for example, to a heat treatment. This process step is associated with a controlled alteration in the particle size of the pigments and the specific surface area thereof. This process is described, for example, in EP-A 0 994 162.

EP-A 2682434 likewise discloses metal azo pigments based on nickel- and zinc-azobarbituric acid and melamine, which can be used as yellow component in colour filters and have improved colouristic properties.

However, the metal azo pigments known from the prior art are still in need of further improvement with regard to the performance features thereof.

SUMMARY OF THE INVENTION

It has been found that metal azo pigments based on azobarbituric acid, zinc salts, nickel salts and melamine and/or melamine derivatives and at least one further metal salt other than zinc and nickel salts surprisingly have improved colour strength. The improvement of these properties enables improved use of these products, inter alia, for colouring of plastics and lacquers, and for use in inlets and as a component of colour filters for LCDs.

DESCRIPTION OF THE EMBODIMENTS

The invention therefore relates to metal azo pigments, characterized in that they comprise the following components:

a) at least three metal azo compounds which differ at least in the type of metal and which each contain structural units of the formula (I), or the tautomeric forms thereof,

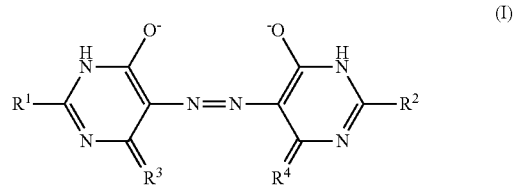

in which
R$^1$ and R$^2$ are each independently OH, NH$_2$ or NHR$^5$,
R$^3$ and R$^4$ are each independently =O or =NR$^5$,
R$^5$ is hydrogen or alkyl, preferably C$_1$-C$_4$-alkyl,
and
Ni$^{2+}$ and/or Zn$^{2+}$ ions and at least one further metal ion Me,
where
Me is a di- or trivalent metal ion selected from the group of La$^{3+}$, Ce$^{3+}$, Pr$^{3+}$, Nd$^{2+}$, Nd$^{3+}$, Sm$^{2+}$, Sm$^{3+}$, Eu$^{2+}$, Eu$^{3+}$, Gd$^{3+}$, Tb$^{3+}$, Dy$^{3+}$, Ho$^{3+}$, Er$^{3+}$, Tm$^{3+}$, Yb$^{2+}$, Yb$^{3+}$, Mg$^{2+}$, Ca$^{2+}$, Sr$^{2+}$, Ba$^{2+}$, Sc$^{3+}$, Y$^{3+}$, Ti$^{2+}$, Ti$^{3+}$, Zr$^{2+}$, Zr$^{3+}$, V$^{2+}$, V$^{3+}$, Nb$^{3+}$, Cr$^{3+}$, Mo$^{2+}$, Mo$^{3+}$, Mn$^{2+}$, Cd$^{2+}$ and Pb$^{2+}$,
with the proviso that the amount of Zn$^{2+}$ and Ni$^{2+}$ ions together is 75 to 99.5 mol % and the amount of metal ions Me is 25 to 0.5 mol %, based in each case on one mole of all metal ions in the metal azo pigment,
and
where the molar ratio is from 90:3 to 3:90, preferably 80:5 to 5:80 and more preferably 60:33 to 33:60,
and b) at least one compound of the formula (II)

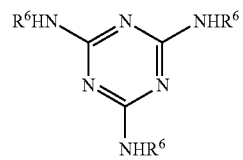

in which
R$^6$ is hydrogen or alkyl, preferably C$_1$-C$_4$-alkyl optionally mono- or polysubstituted by OH.

Preferably, in formula (I), R$^1$ and R$^2$ are each independently OH, NH$_2$, or an NHR$^5$ radical where R$^5$ is hydrogen or C$_1$-C$_4$ alkyl.

Preferably, in formula (I), R$^3$ and R$^4$ are each independently =O or =NR$^5$ where R$^5$ is hydrogen or C$_1$-C$_4$-alkyl.

More preferably, in formula (I), R$^1$ and R$^2$ are OH and R$^3$ and R$^4$ are =O.

Preferably, in formula (II), R$^6$ is hydrogen or C$_1$-C$_4$-alkyl optionally mono- or polysubstituted by OH. More preferably, in formula (II), R$^6$ is hydrogen.

Based on one mole of all metal ions present in the metal azo pigment, the amount of Zn$^{2+}$ and Ni$^{2+}$ ions together is generally 75 to 99.5 mol % and the amount of metal ions Me 25 to 0.5 mol %; the amount of Zn$^{2+}$ and Ni$^{2+}$ ions together is preferably 78 to 95 mol % and the amount of metal ions Me 5 to 23 mol %, and the amount of Zn$^{2+}$ and Ni$^{2+}$ ions together is more preferably 82 to 90 mol % and the amount of metal ions Me 10 to 18 mol %.

The molar ratio of $Zn^{2+}$ tri $Ni^{2+}$ ions in the metal azo pigment is generally 90:3 to 3:90, preferably 80:5 to 5:80 and more preferably 60:33 to 33:60.

Substituents in the definition of alkyl denote, for example, straight-chain or branched $C_1$-$C_6$-alkyl, preferably straight-chain or branched $C_1$-$C_4$-aklyl, which may optionally be mono- or polysubstituted identically or differently, for example by halogen such as chlorine, bromine or fluorine; —OH, —CN, —$NH_2$ or $C_1$-$C_6$-alkoxy.

Said metal ions Me are preferably in their most stable oxidation states. In general, Me is a di- or trivalent metal ion selected from the group of $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, $Yb^{3+}$, $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Cd^{2+}$ and $Pb^{2+}$.

Preferably, Me is a di- or trivalent metal ion selected from the group of $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Mg^{2+}$, $Ca^{2+}$, $Sr^{2+}$, $Y^{3+}$ and $Mn^{2+}$, and more preferably from the group of $La^{3+}$, $Ce^{3+}$, $Pr^{3+}$, $Nd^{3+}$, $Sm^{3+}$, $Tb^{3+}$, $Ho^{3+}$ and $Sr^{2+}$.

In the case that the metal azo compounds of component a) contain divalent metal ions Me, the structural units of the formula (I) and the metal ions Me can be regarded as complexes, for example those of the formula (Ia)

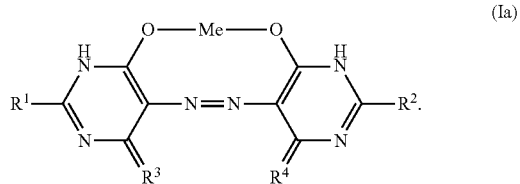

(Ia)

However, it is also possible that the metal ion is bonded via the nitrogen atoms in a tautomeric notation of the formula (Ia).

The same formula representation can be applied to the structural units of the formula (I) with the $Zn^{2+}$ ions or with the $Ni^{2+}$ ions. This representation serves merely for illustration and does not make any claim to scientific correctness.

In the case that Me is a trivalent metal ion, the charge is balanced preferably by an equivalent amount of anionic structural units of the formula (I).

Preferably, the charge of the doubly negatively charged structural units of the formula (I) is balanced to an extent of 80% to 100%, more preferably to an extent of 95% to 100% and most preferably to an extent of 99.9% to 100% by the sum total of all $Zn^{2+}$, $Ni^{2+}$ and further metal ions Me present in the metal azo pigment.

Preferably, said metal azo compounds of components a) form adducts with components b), i.e. the compounds of the formula (II).

Adducts are understood here to mean molecular assemblies in general. The bond between the molecules here may be the result, for example, of intermolecular interactions or Lewis acid-base interactions or of coordinate bonds.

The term "adduct" in the context of the present invention shall generally encompass all kinds of intercalation and addition compounds.

The terms "intercalation compound" or "addition compound" in the context of the present invention shall be understood, for example, to mean compounds which are formed on the basis of intermolecular interactions such as van der Waals interactions or else Lewis acid-base interactions. The way in which the intercalation proceeds here depends both on the chemical properties of the component to he intercalated and on the chemical nature of the host lattice. Compounds of this kind are frequently also referred to as intercalation compounds. In a chemical sense, this is understood to mean the intercalation of molecules and ions (less commonly atoms as well) into chemical compounds.

This shall additionally also be understood to mean inclusion compounds called clathrates. These are compounds of two substances, one of which is a guest molecule intercalated into a lattice or cage composed of a host molecule.

The terms "intercalation compound" or "addition compound" in the context of the present invention shall also be understood to mean mixed intercalation crystals (including interstitial compounds). These are chemical non-stoichiometric crystalline compounds composed of at least two elements.

In addition, the terms "intercalation compound" or "addition compound" in the context of the present invention shall also be understood to mean compounds which are formed on the basis of coordinate bonds or complex bonds. Compounds of this kind refer, for example, to mixed substitution crystals or mixed replacement crystals in which at least two substances form a common crystal and the atoms of the second component are at regular lattice sites of the first component.

Preference is given to metal azo pigments comprising the adducts of
  a) at least three metal azo compounds which differ at least in the type of metal and which each contain structural units of the above-specified formula (I)
     in which $R^1$ and $R^2$ are OH,
     and
     $R^3$ and $R^4$ are =O,
     and
     $Ni^{2+}$ and/or $Zn^{2+}$ ions and at least one further metal ion Me,
     where
     Me is a di- or trivalent metal ion selected from the group of $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$ and $Yb^{3+}$, $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Cd^{2+}$ and $Pb^{2+}$,
     with the proviso that the amount of $Zn^{2+}$ and $Ni^{2+}$ ions together is 75 to 99.5 mol % and the amount of metal ions Me is 25 to 0.5 mol %, based in each case on one mole of all metal ions in the metal azo pigment,
     and
     where the molar ratio of $Zn^{2+}$ to $Ni^{2+}$ ions in the metal azo pigment is 90:3 to 3:90, preferably 80:5 to 5:80 and more preferably 60:33 to 33:60,
     and
  b) at least one compound of the above specified formula (II)
     in which
     is hydrogen, Particular preference is given to metal azo pigments comprising the adducts of
  a) at least three metal azo compounds which differ at least in the type of metal and which each contain structural units of the above-specified formula (I)
     in which $R^1$ and $R^2$ are OH,
     and
     $R^3$ and $R^4$ are =O and Ni$^{2+}$ and/or Zn$^{2+}$ ions and at least one further metal ion Me, where Me is a di- or trivalent metal ion selected from the group of La$^{3+}$, Ce$^{3+}$, Pr$^{3+}$, Nd$^{3+}$, Sm$^{3+}$, Eu$^{3+}$, Gd$^{3+}$, Tb$^{3+}$, Dy$^{3+}$, Ho$^{3+}$, Er$^{3+}$, Tm$^{3+}$ and Yb$^{3+}$, Mg$^{2+}$, Ca$^{2+}$, Sr$^{2+}$, Y$^{3+}$ and Mn$^{2+}$, and more preferably from the group of La$^{3+}$, Ce$^{3+}$, Pr$^{3+}$, Nd$^{3+}$, Sm$^{3+}$, Tb$^{3+}$, Ho$^{3+}$ and Sr$^{2+}$, with the proviso that the amount of Zn$^{2+}$ and Ni$^{2+}$ ions together is 75 to 99.5 mol % and the amount of metal ions Me is 25 to 0.5 mol %, based in each case on one mole of all metal ions in the metal azo pigment, and where the molar ratio of Zn$^{2+}$ to Ni$^{2+}$ ions in the metal azo pigment is 90:3 to 3:90, preferably 80:5 to 5:80 and more preferably 60:33 to 33:60, and b) at least one compound of the above-specified formula (II)

in which

R$^6$ is hydrogen.

Compounds suitable for forming an adduct in the sense of the above definition with the metal azo compounds of component a) may be either organic or inorganic compounds. These compounds are referred to hereinafter as adduct formers.

Adduct formers suitable in principle come from an extremely wide variety of different compound classes. For purely practical reasons, preference is given to those compounds which are solid or liquid under standard conditions (25° C., 1 bar).

Among the liquid substances, preference is generally given to those having a boiling point of 100° C. or higher, preferably of greater than or equal to 150° C. at 1 bar. Suitable adduct formers are generally acyclic and cyclic organic compounds, for example aliphatic and aromatic hydrocarbons which may be substituted, for example, by OH, COOH, NH$_2$, substituted NH$_2$, CONH$_2$, substituted CONH$_2$, SO$_2$NH$_2$, substituted SO$_2$NH$_2$, SO$_3$H, halogen, NO$_2$, CN, —SO$_2$-alkyl, —SO$_2$-aryl, —O-alkyl, —O-aryl, —O-acyl.

Carboxamides and sulphonamides are a preferred group of adduct formers; also especially suitable are urea and substituted ureas such as phenylurea, dodecylurea and others, and the polycondensates thereof with aldehydes, especially formaldehyde; heterocycles such as barbituric acid, benzimidazolone, benzimidazolone-5sulphonic acid, 2,3-dihydroxyquinoxaline, 2,3-dihydroxyquinoxaline-6-sulphonic acid, carbazole, carbazole-3,6-disulphonic acid, 2-hydroxyquinoline, 2,4-dihydroxyquinoline, caprolactam, melamine, 6-phenyl-1,3,5-triazine-2,4-diamine, 6-methyl-1,3,5-triazine-2,4-diamine, cyanuric acid.

Likewise suitable in principle as adduct formers are polymers, preferably water-soluble polymers, for example ethylene-propylene oxide block polymers, preferably having an M$_n$ greater than or equal to 1000, especially from 1000 to 10 000 g/mol, polyvinyl alcohol, poly(meth)acrylic acids, modified cellulose such as carboxymethyl celluloses, hydroxyethyl and -propyl celluloses, methyl and ethyl hydroxyethyl celluloses, According to the invention, the adduct formers used are those of the formula (II). Especially preferred here is melamine.

In general, the metal azo pigments of the invention contain 0.05 to 4 mol, preferably 0.5 to 2.5 mol and most preferably 1.0 to 2.0 mol of compounds of the formula (II) per mole of structural units of the formula (I).

The metal azo pigments of the invention preferably have a specific surface area (m$^2$/g) of 50 to 200 m$^2$/g, especially 80 to 160 m$^2$/g, most preferably 100 to 150 m$^2$/g. The surface area is determined in accordance with DIN 66131: determination of the specific surface area of solids by gas adsorption according to Brunaner, Emmett and Teller (B.E.T).

The metal azo pigments of the invention may be physical mixtures or chemical mixed compounds.

Preferably, the physical mixtures are mixtures of adducts of said metal azo compounds of component a) and the compounds of the formula (II) of component b) which differ at least in terms of the type of metals. Preferred examples are the physical mixture of the adducts of a1) the pure Ni azo compound with b1) melamine and the adducts of a2) the pure Zn azo compound with b2) melamine and the adducts of a3) at least one further Me azo compound with b3) melamine.

The chemical mixed compounds are, for example and with preference, adducts of metal azo compounds of component a) with compounds of the formula (II) of component b), preferably melamine, where the Zn$^{2+}$ and Ni$^{2+}$ ions, and any further metal ion Me, are incorporated into a common crystal lattice.

The metal azo pigments according to the invention can be prepared by reaction of alkali metal salts of the formula (III), or tautomers thereof, preferably of the sodium or potassium salts, in the presence of at least one compound of the formula (II), with nickel salts and zinc salts and one or more metal salts from the group of the lanthanum, cerium, praseodymium, neodymium, samarium, europium, gadolinium, terbium, dysprosium, holmium, ytterbium, erbium, thulium, magnesium, calcium, strontium, barium, yttrium, scandium, titanium, niobium, molybdenum, manganese, vanadium, zirconium, cadmium, chromium and lead salts, preferably from the group of the lanthanum, cerium, praseodymium, neodymium, samarium, europium, gadolinium, terbium, dysprosium, holmium, ytterbium, erbium, thulium, magnesium, calcium, strontium, manganese and yttrium salts, and more preferably from the group of the lanthanum, cerium, praseodymium, neodymium, samarium, terbium, holmium and strontium salts.

The metal azo pigments of the invention can also be prepared by mixing the adducts of a1) metal azo compounds containing structural units of the formula (I) and Ni$^{2+}$ ions and b1) compounds of the formula (II) with adducts of a2) metal azo compounds containing structural units of the formula (I) and Zn$^{2+}$ ions and b2) compounds of the formula (II) with adducts of a3) metal azo compounds containing structural units of the formula (I) and metal ions Me and b3) compounds of the formula (II).

The present invention further provides a process for producing the metal azo pigments of the invention, which is characterized in that at least one compound of the formula (III), or tautomers thereof,

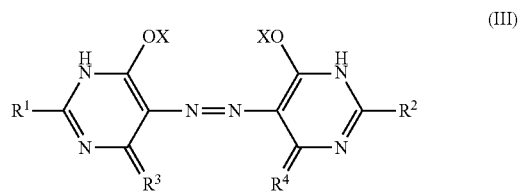

(III)

in which

X is an alkali metal ion, preferably a sodium or potassium ion, $R^1$ and $R^2$ are each independently OH, $NH_2$ or $NHR^5$, $R^3$ and $R^4$ are each independently =O or =$NR^5$, and $R^5$ is hydrogen or alkyl, preferably $C_1$-$C_4$-alkyl, in the presence of at least one compound of the formula (II), is reacted simultaneously or successively with at least one nickel salt and at least one zinc salt and with at least one further metal salt from the group of the $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, $Yb^{3+}$, $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Cd^{2+}$, and $Pb^{2+}$ salts, preferably from the group of $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Mg^{2+}$, $Ca^{2+}$, $Sr^{2+}$, $Y^{3+}$ and $Mn^{2+}$ salts and more preferably from the group of $La^{3+}$, $Ce^{3+}$, $Pr^{3+}$, $Nd^{3+}$, $Sm^{3+}$, $Tb^{3+}$, $Ho^{3+}$ and $Sr^+$ salts, where 0.03 to 0.95 mol of at least one nickel salt, 0.03 to 0.95 mol of at least one zinc salt and 0.005 to 0.25 mol of at least one further metal salt from the abovementioned group of metal salts are used per mole of compound of the formula (III), and the sum total of the molar amounts of all these metal salts is one mole in total.

Preferably, 0.05 to 0.8 mol of at least one nickel salt and 0.05 to 0.8 mol of at least one zinc salt and 0.01 to 0.2 mol of at least one further metal salt from the abovementioned group are used per mole of compound of the formula (III).

Most preferably, 0.3 to 0.6 mol of at least one nickel sail and 0.3 to 0.6 mol of at least one zinc salt and 0.12 to 0.18 mol of at least one further metal salt from the abovementioned group are used per mole of compound of the formula (III).

In general, the process of the invention is performed using 0.05 to 4 mol, preferably 0.5 to 2.5 mol and most preferably 1.0 to 2.0 mol of compound of the formula (II) per mole of compound of the formula (III).

Alternatively, for the preparation, instead of the di-alkali metal compound of the formula (III), it is also possible to use a mono-alkali metal compound of the formula (IIIa), or tautomers thereof,

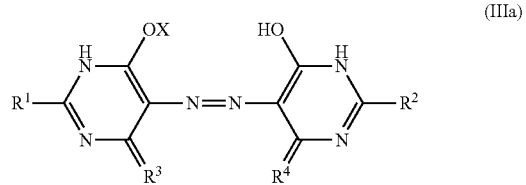

(IIIa)

in which X, $R^1$, $R^2$, $R^3$ and $R^4$ have the definition given for formula (III), or a mixture of compounds of the formula (III) and (IIIa). The stated molar amounts of nickel and zinc salts and the further metal salts from the abovementioned group and of compounds of the formula (II) in these cases relate to the sum total of the molar amounts of the compounds (III) and (IIIa) used.

The process of the invention is generally conducted at a temperature of 60 to 95° C. in aqueous solution at a pH below 7. The nickel and zinc salts for use in accordance with the invention and the further metal salts from the above-mentioned group can be used individually or as a mixture with one another, preferably in the form of an aqueous solution. The compounds of the formula (II) may likewise be added individually or as a mixture with one another, preferably in the form of the solids.

In general, the process of the invention is conducted in such a way that the azo compound of the formula (III), preferably as the sodium or potassium salt, is initially charged, one or more compounds of the formula (II), preferably melamine, is/are added and then reaction is effected successively or simultaneously with at least one nickel salt and at least one zinc salt and one or more metal salts from the above-specified group, preferably in the form of the aqueous solutions of these salts, preferably at pH values less than 7. Suitable substances for adjusting the pH are sodium hydroxide solution, potassium hydroxide solution, sodium carbonate, sodium hydrogencarbonate, potassium carbonate and potassium hydrogencarbonate.

Useful nickel and zinc salts preferably include the water-soluble salts thereof, especially chlorides, bromides, acetates, formates, nitrates, sulphates, etc. Nickel and zinc salts used with preference have a water solubility of more than 20 g/l, especially more than 50 g/l, at 20° C.

Useful further metal salts from the group of the lanthanum, cerium, praseodymium, neodymium, samarium, europium, gadolinium, terbium, dysprosium, holmium, ytterbium, erbium, thulium, magnesium, calcium, strontium, barium, yttrium, scandium, titanium, niobium, molybdenum, manganese, vanadium, zirconium, cadmium, chromium and lead salts preferably include the water-soluble salts thereof, especially the chlorides, bromides, acetates, nitrates and sulphates thereof, preferably the chlorides thereof.

The metal azo pigments of the invention obtained in this way can then be isolated by filtration of the aqueous suspensions thereof as an aqueous filtercake. This filtercake, optionally after washing with hot water, can be dried by means of standard drying methods.

Useful drying methods include, for example, paddle drying or spray drying of corresponding aqueous slurries.

Subsequently, the pigment can be reground.

If the metal azo pigments of the invention have excessively hard grains or are too hard to be dispersed for the desired application, they can be converted to soft-grained pigments, for example by the method described in DE-A 19 847 586.

The present invention further provides a process for producing the metal azo pigments of the invention, which is characterized in that (i) at least one adduct of a1) a metal azo compound containing structural units of the above-specified formula (I)

in which $R^1$, $R^2$, $R^3$, $R^4$ and $R^5$ have the above-specified general and preferred definition, and $Zn^{2+}$ ions, and b1) at least one compound of the above-specified formula (II) in which $R^6$ has the general and preferred definitions given above, and the amount of $Zn^{2+}$ metal ions is 100 mol %, based on one mole of all metal ions in the adduct a1)/b1), with (ii) at least one adduct of a2) a metal azo compound containing structural units of the above-specified formula (I)

in which
R$^1$, R$^2$, R$^3$, R$^4$ and R$^5$ have the above-specified general and preferred definition,
Ni$^{2+}$ ions,
and
b2) at least one compound of the above-specified formula (II) in which R$^6$ has the general and preferred definitions given above,
and the amount of Ni$^{2+}$ metal ions is 100 mol %, based on one mole of all metal ions in the adduct a2)/b2),
and
(iii) at least one adduct of
a3) a metal azo compound containing structural units of the above-specified formula (I)
in which
R$^1$, R$^2$, R$^3$, R$^4$ and R$^5$ have the above-specified general and preferred definition,
and
at least one metal ion Me,
and
b3) at least one compound of the above-specified formula (II) in which R$^6$ has the general and preferred definitions given above,
and the amount of Me metal ions is 100 mol %, based on one mole of all metal ions in the adduct a3)/b3), are mixed with one another, where 0.03 to 30 mol of adduct a2)/b2) are used and 0.005 to 0.33 mol of adduct a3)/b3) are used per mole of adduct as based on the sum total of the molar amount of adducts a1)/b1) and a2)/b2).

The metal azo pigments of the invention are notable for particularly good dispersibility and a high colour intensity. Chroma and transparency have excellent adjustability.

The metal azo pigments of the invention are of excellent suitability for all pigment applications, especially also in the form of the pigment preparations thereof.

The present invention further provides pigment preparations comprising at least one metal azo pigment of the invention and at least one auxiliary and/or additive.

Useful auxiliaries or additives generally include all additions that are customary for pigment preparations, for example those from the group of the surface-active agents such as dispersants, surfactants, wetting agents, emulsifiers, and those from the group of the surface-covering agents, bases and solvents. In principle, the auxiliary or additive is guided by the nature of the target system. If the target system is, for example, a lacquer or a printing ink, the auxiliary or additive is then selected so as to achieve maximum compatibility with the target system.

Preferably, the pigment preparations of the invention comprise at least one surface-active agent.

Surface-active agents in the context of the present invention are especially understood to mean dispersants, which stabilize the pigment particles in their fine particulate form in aqueous media. "Fine particulate" is preferably understood to mean a fine distribution of 0.001 to 5 μm, especially of 0.005 to 1 μm, more preferably of 0.005 to 05 μm. The pigment preparation of the invention is preferably in fine particulate form.

Suitable surface-active agents are, for example, anionic, cationic, amphoteric or nonionic in nature.

Suitable anionic surface-active agents (c) are especially condensation products of aromatic sulphonic acids with formaldehyde, such as condensation products of formaldehyde and alkylnaphthalenesulphonic acids or of formaldehyde, naphthalenesulphonic acids and/or benzenesulphonic acids, condensation products of optionally substituted phenol with formaldehyde and sodium bisulphite. Also suitable are surface-active agents from the group of the sulphosuccinic esters and alkylbenzesulphonates. Also ionically modified, especially sulphated or carboxylated, alkoxylated fatty acid alcohols or salts thereof. Alkoxylated fatty acid alcohols are especially understood to mean those C$_6$-C$_{22}$ fatty acid alcohols endowed with 5 to 120, preferably 5 to 60 and especially with 5 to 30 mol of ethylene oxide, which are saturated or unsaturated. Additionally useful are lignosulphonates in particular, for example those which are obtained by the sulphite or Kraft process. They are preferably products which are partially hydrolysed, oxidized, propoxylated, sulphonated, sulphomethylated or desulphonated and which are fractionated by known methods, for example according to the molecular weight or the degree of sulphonation. Mixtures of sulphite and Kraft lignosulphonates are also very effective. Especially suitable are lignosulphonates with an average molecular weight between 1000 and 100 000 g/mol, a content of active lignosulphonate of at least 80% by weight and, preferably, a low content of polyvalent cations. The degree of sulphonation can be varied within wide limits.

Examples of useful nonionic surface-active agents include: reaction products of alkylene oxides with compounds capable of being alkylated, such as, for example, fatty alcohols, fatty amines, fatty acids, phenols, alkylphenols, arylalkylphenols, such as styrene-phenol condensates, carboxamides and resin acids. These are, for example, ethylene oxide adducts from the class of the reaction products of ethylene oxide with:

1) saturated and/or unsaturated fatty alcohols having 6 to 22 carbon atoms or
2) alkylphenols having 4 to 12 carbon atoms in the alkyl radical or
3) saturated and/or unsaturated fatty amines having 14 to 20 carbon atoms or
4) saturated and/or unsaturated fatty acids having 14 to 20 carbon atoms or
5) hydrogenated and/or unhydrogenated resin acids.

Useful ethylene oxide adducts especially include the alkylatable compounds mentioned in 1) to 5) having 5 to 120, especially 5 to 100, especially 5 to 60 and more preferably 5 to 30 mol of ethylene oxide.

Suitable surface-active agents are likewise the esters of the alkoxylation product of the formula (X) that are known from DE-A 19 712 486 or from DE-A 19 535 246, which correspond to the formula (XI), and the latter optionally in a mixture with the parent compounds of the formula (X). The alkoxylation product of a styrene-phenol condensate of the formula (X) is as defined below:

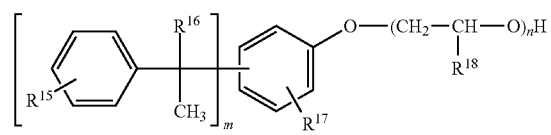

(X)

in which
R$^{15}$ is hydrogen or C$_1$-C$_4$-alkyl,
R$^{16}$ is hydrogen or CH$_3$,
R$^{17}$ is hydrogen, C$_1$-C$_4$-alkyl, C$_1$-C$_4$-alkoxy, C$_1$-C$_4$-alkoxycarbonyl or phenyl,
m is a number from 1 to 4,
n is a number from 6 to 120,
R$^{18}$ is the same or different for every unit indicated by a and is hydrogen, CH$_3$ or phenyl, where, in the case that CH$_3$ is present in some of the different —(—CH$_2$—CH(R$^{18}$)—O—) groups, R$^{18}$ is CH$_3$ in 0% to 60% of the total value of n and R$^{18}$ is hydrogen in 100% to 40% of the total value of n, and where, in the case that phenyl is present in some of the different —(—CH$_2$—CH(R$^{18}$)—O—) groups, R$^{18}$ is phenyl in 0% to 40% of the total value of n and R$^{18}$ is hydrogen in 100% to 60% of the total value of n.

The esters of the alkoxylation products (X) correspond to the formula (XI)

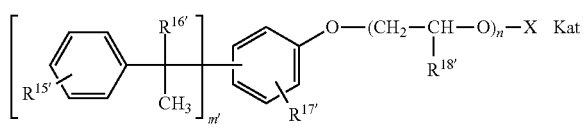

(XI)

in which
R$^{15'}$, R$^{16'}$, R$^{17'}$, R$^{18'}$, m' and n' assume the scope of the definition of R$^{15}$, R$^{16}$, R$^{17}$, R$^{18}$, m and n, but independently thereof, X is the —SO$_3$, —SO$_2$, —PO$_3$ or —CO—(R$^{19}$)—COO group, Kat is a cation from the group of H, Li, Na, K, NH$_4$ or HO—CH$_2$CH$_2$—NH$_3$, where two Kat are present in the case that X=—PO$_3$, and R$^{19}$ is a divalent aliphatic or aromatic radical, preferably C$_1$-C$_4$-alkylene, especially ethylene, C$_2$-C$_4$ monounsaturated radicals, especially acetylene or optionally substituted phenylene, especially ortho-phenylene, where possible substituents preferably include C$_1$-C$_4$-alkyl, C$_1$-C$_4$-alkoxy, C$_1$-C$_4$-alkoxycarbonyl or phenyl.

A preferred surface-active agent used is the compound of the formula (XI). Preferably a compound of the formula (XI) in which X is a radical of the formula —CO—(R$^{19}$)—COO$^-$ and R$^{19}$ is as defined above.

Preference is likewise given to using, as surface-active agent, a compound of the formula (XI) together with a compound of the formula (X). Preferably, the surface-active agent in this case contains 5% to 99% by weight of the compound (XI) and 1% to 95% by weight of the compound (X).

The surface-active agent of component (c) is preferably used in the pigment preparation in an amount of 0.1% to 100% by weight, especially 0.5% to 60% by weight, based on the metal azo pigment of the invention used.

It will be appreciated that the pigment preparation of the invention may also contain further additions. For example, additions which lower the viscosity of an aqueous suspension and/or increase the solids content, for example carboxamides and sulphonamides, may be added in an amount of up to 10% by weight, based on the pigment preparation.

Further additions are, for example, inorganic and organic bases, and additions customary for pigment preparations.

Bases include: alkali metal hydroxides, for example NaOH, KOH or organic amines such as alkylamines, especially alkanolamines or alkylalkanolamines.

Particularly preferred examples include methylamine, dimethylamine, trimethylamine, ethanolamine, n-propanolamine, n-butanolamine, diethanolamine, triethanolamine, methylethanolamine or dimethylethanolamine.

Examples of suitable carboxamides and sulphonamides include: urea and substituted ureas such as phenylurea, dodecylurea and others; heterocycles such as barbituric acid, benzimidazolone, benzimidazolone-5-sulphonic acid, 2,3-dihydroxyquinoxaline, 2,3-dihydroxyquinoxaline-6-sulphonic acid, carbazole, carbazole-3,6-disulphonic acid, 2-hydroxyquinoline, 2,4-dihydroxyquinoline, caprolactam, melamine, 6-phenyl-1,3,5-triazine-2,4-diamine, 6-methyl-1,3,5,-triazine-2,4-diamine, cyanuric acid.

The base is optionally present up to an amount of 20% by weight, preferably to 10% by weight, based on the pigment.

In addition, the pigment preparations of the invention may still contain inorganic and/or organic salts as a result of the preparation.

The pigment preparations of the invention are preferably solid at room temperature. More particularly, the pigment preparations of the invention are in the form of powders or granules.

The pigment preparations of the invention are of excellent suitability for all pigment applications.

The present invention further provides for the use of at least one metal azo pigment of the invention or of a pigment preparation of the invention for pigmentation of all kinds of lacquers for the production of printing inks, distempers or emulsion paints, for the bulk colouring of paper, for the bulk colouring of synthetic, semisynthetic or natural macromolecular substances, for example polyvinyl chloride, polystyrene, polyamide, polyethylene or polypropylene. They can also be used for the spin dyeing of natural, regenerated or synthetic fibres, for example cellulose, polyester, polycarbonate, polyacrylonitrile or polyamide fibres, and for printing of textiles and paper. These pigments can be used to produce finely divided, stable, aqueous pigmentations for emulsion paints and other paints usable for paper colouring, for the pigment printing of textiles, for laminate printing or for the spin dyeing of viscose, by grinding or kneading in the presence of nonionic, anionic or cationic surfactants.

The metal azo pigments of the invention are additionally of excellent suitability for inkjet applications and for colour filters for liquid-crystal displays.

In a likewise preferred embodiment, the pigment preparations of the invention comprise at least one organic compound (d) selected from the group of the terpenes, terpenoids, fatty acids, fatty acid esters and the home- or copolymers, such as random or block copolymers having a solubility in pH-neutral water at 20° C. of less than 1 g/l, especially less than 0.1 g/l. The organic compound (d) is preferably solid or liquid at room temperature (20° C.) under standard atmosphere and, if it is liquid, has a boiling point of preferably >100° C., especially >150° C.

Preferred polymers have both a hydrophilic and a hydrophobic, preferably polymeric, molecular moiety. Examples of such polymers are random copolymers based on fatty acids or long-chain C$_{12}$-C$_{22}$ hydrocarbons and polyalkylene glycols, especially polyethylene glycol. Also block copolymers based on (poly)hydroxy fatty acids and polyalkylene glycol, especially polyethylene glycol, and also graft copolymers based on poly(meth)acrylate and polyalkylene glycol, especially polyethylene glycol.

Preferred compounds from the group of the terpenes, terpenoids, fatty acids and fatty acid esters include: ocimene, myrcene, geraniol, nerol, linalool, citronellol, geranial, citronellal, neral, limonene, menthol, for example (−)-menthol, menthone or bicyclic monoterpenes, saturated and unsaturated fatty acids having 6 to 22 carbon atoms, for example oleic acid, linoleic acid and linolenic acid or mixtures thereof.

Also useful as organic compounds of component (d) are the abovementioned adduct formers, provided that they obey the criteria desired for the compound of component (d).

Particularly preferred pigment preparations comprise:
50%-99% by weight of at least one metal azo pigment of the invention and
1%-50% by weight, preferably 2% to 50% by weight of at least one compound of component (d).

Optionally, the pigment preparation of the invention additionally comprises a surface-active agent (c).

More preferably, the preparations of the invention consist to an extent of more than 90% by weight, preferably more than 95% by weight and especially more than 97% by weight of at least one metal azo pigment of the invention, at least one organic compound of component (d) and optionally at least one surface-active agent of component (c) and optionally at least one base.

The pigment preparations of the invention in this composition are especially suitable for pigmentation of inkjet inks and colour filters for liquid-crystal displays.

The present invention further provides a process for producing the pigment preparations of the invention, which is characterized in that at least one metal azo pigment of the invention and at least one auxiliary or additive, especially at least one organic compound of component (d) and optionally at least one surface-active agent of component (c) and optionally at least one base are mixed with one another.

The present invention likewise provides for the use of the metal azo pigments of the invention or of the pigment preparations of the invention for production of colour filters for liquid-crystal displays. This use will be described hereinafter using the example of the pigment dispersion method according to the photoresist process.

The inventive use of the pigment preparations of the invention for production of colour filters is characterized in that, for example, at least one metal azo pigment of the invention or a pigment preparation of the invention, especially a solid pigment preparation, is homogenized, optionally with a binder resin and an organic solvent, optionally with addition of a dispersant, and then wet-comminuted continuously or batchwise to a particle size by number (electron microscopy determination) of 99.5%<1000 nm, preferably 95%<500 nm and especially 90%<200 nm.

Useful wet comminution methods include, for example, stirrer or dissolver dispersion, grinding by means of stirred ball mills or bead mills, kneaders, roll mills, high-pressure homogenization or ultrasound dispersion.

During the dispersion treatment or thereafter, at least one photocurable monomer and a photoinitiator are added. After the dispersion, it is possible to introduce further binder resin, solvent, or admixtures customary for photoresists, as required for the desired photosensitive coating agent formulation (photoresist) for production of the colour filters, In the context of this invention, a photoresist is understood to mean a preparation comprising at least one photocurable monomer and a photoinitiator.

The present invention also provides a process for producing colour filters for liquid-crystal displays, which is characterized in that at least one metal azo pigment of the invention or a pigment preparation of the invention is homogenized, optionally with a binder resin and an organic solvent, optionally with addition of a dispersant, and then wet-comminuted continuously or batchwise to a particle size by number (electron microscopy determination) of 99.5%<1000 nm and, during the dispersion treatment or thereafter, at least one photocurable monomer and a photoinitiator are added.

Useful possible dispersants include dispersants which are suitable for this application and are generally commercially available, for example polymeric, ionic or nonionic dispersants, for example based on polycarboxylic acids or polysulphonic acids, and also polyethylene oxide-polypropylene oxide block copolymers. In addition, it is also possible to use derivatives of organic dyes as dispersants or co-dispersants.

The production of colour filters therefore gives rise to "formulations" comprising, based on the formulation:
at least one metal azo pigment of the invention,
optionally a binder resin,
at least one organic solvent and
optionally a dispersant.

In a preferred embodiment, the formulation contains (figures based on formulation):
1%-50% by weight of a metal azo pigment of the invention
0%-20% by weight of binder resin
0%-20% by weight of dispersant
10%-94% by weightof organic solvent.

The coating of the photoresist onto a plate to produce the coloured image element patterns can be accomplished either by direct or indirect application. Examples of application methods include: roller coating, spin coating, spray coating, dip coating and air-knife coating.

Useful plates include, according to the application, for example: transparent glasses such as white or blue glass plates, silicate-coated blue glass plate, synthetic resin plate or films based, for example, on polyester resin, polycarbonate resin, acrylic resin or vinyl chloride resin, and also metal plates based on aluminium, copper, nickel or steel, and ceramic plates or semiconductor plates having applied photoelectric transfer elements.

The application is generally effected such that the layer thickness of the photosensitive layer obtained is 0.1 to 10 μm.

The application may be followed by thermal drying of the layer.

The exposure is preferably effected by exposing the photosensitive layer to an active light beam, preferably in the form of an image pattern by means of a photomask. In this way, the layer is cured at the exposed sites. Suitable light sources are, for example: high-pressure and ultrahigh-pressure mercury vapour lamp, xenon lamp, metal halide lamp, fluorescent lamp, and laser beam in the visible region.

The development which follows the exposure removes the unexposed portion of the coating and gives the desired image pattern form of the colour elements. Standard development methods include spraying with or dipping into aqueous alkaline developer solution or into an organic solvent comprising inorganic alkali, for example sodium hydroxide or potassium hydroxide, sodium metasilicate or organic bases such as monoethanolamine, diethanolamine, triethanolamine, triethylamine or salts thereof.

The development is generally followed by a thermal post-drying/curing of the image patterns.

The inventive use of the metal azo pigments is preferably characterized in that they are used alone or in a mixture with other pigments that are customary for the production of colour filters in the colour filters or pigment preparations or formulations for colour filters.

These "other pigments" may either be other metal salts of an azo compound of the formula (I) or pigment preparations based thereon or other inorganic or organic pigments.

With regard to the selection of any other pigments to be used as well, there is no restriction in accordance with the invention. Both inorganic and organic pigments are useful.

Preferred organic pigments are, for example, those of the monoazo, disazo, laked azo, β-naphthol, naphthol AS, benzimidazolone, disazo condensation, azo metal complex, isoindoline and isoindolinone series, and also polycyclic pigments, for example from the phthalocyanine, quinacridone, perylene, perinone, thioindigo, anthraquinone, dioxazine, quinopthalone and diketopyrrolopyrrole series. Also laked dyes such as Ca, Me and Al lakes of sulpho- or carboxyl-containing dyes.

Examples of other organic pigments which can optionally be used in addition are:
Colour Index Pigment Yellow 12, 13, 14, 17, 20, 24, 74, 83, 86, 93, 94, 109, 110, 117, 125, 137, 138, 139, 147, 148, 150, 153, 154, 166, 173, 185, or
Colour Index Pigment Orange 13, 31, 36, 38, 40, 42, 43, 51, 55, 59, 61, 64, 65, 71, 72, 73 or
Colour Index Pigment Red 9, 97, 122, 123, 111, 149, 166, 168, 177, 180, 192, 215, 216, 224, 254, 272, or
Colour Index Pigment Green 7, 10, 36, 37, 45, 58 or
Colour Index Pigment Blue 15, 15:1, 15:2, 15:3, 15:4, 15:6, 16 and
Colour Index Pigment Violet 19, 23.

In addition, it is also possible to use soluble organic dyes in conjunction with the novel pigments of the invention.

If "other pigments" are used in addition, the proportion of metal azo pigment of the invention is preferably 1%-99% by weight, especially 20%-80% by weight, based on the total amount of all pigments used. Particular preference is given to the pigment preparations of the invention and to formulations comprising at least one metal azo pigment of the invention and C.I. Pigment Green 36 and/or C.I. Pigment Green 58 in a ratio of 20% to 80% by weight of metal azo pigment to 80% to 20% by weight of C.I. Pigment Green 36 and/or C.I. Pigment Green 58, preferably of 40% to 60% by weight to 60% to 40% by weight.

There is no particular restriction in accordance with the invention with regard to the binder resins which can be used together with the "pigment" or pigment preparations based thereon in colour filters or in the formulations for production of colour filters, for example by the pigment dispersion method, and useful binder resins are especially the film-forming resins known per se for use in colour filters.

For example, useful binder resins include those from the group of the cellulose resins such as carboxymethyl hydroxyethyl cellulose and hydroxyethyl cellulose, acrylic resins, alkyd resins, melamine resins, epoxy resins, polyvinyl alcohols, polyvinylpyrrolidones, polyamides, polyamide imines, polyimides,
polyamide precursors such as those of the formula (14) disclosed in JP-A 11 217 514, and the esterification products thereof.

Examples of these include reaction products of tetracarboxylic dianhydride with diamines.

Useful binder resins also include those which contain photopolymerizable unsaturated bonds. The binder resins may, for example, be those formed from the group of acrylic resins. Particular mention should be made here of homo- and copolymers of polymerizable monomers, for example methyl (meth)acrylate, ethyl (meth)acrylate, propyl (meth) acrylate, butyl (meth)acrylate, styrene and styrene derivatives, and also copolymers between carboxyl-bearing polymerizable monomers such as (meth)acrylic acid, itaconic acid, maleic acid, maleic anhydride, monoalkyl maleates, especially with alkyl having 1 to 12 carbon atoms, and polymerizable monomers such as (meth)acrylic acid, styrene and styrene derivatives, for example α-methylstyrene, m- or p-methoxystyrene, p-hydroxystyrene. Examples include reaction products of carboxyl-containing polymeric compounds with compounds each containing an oxirane ring and an ethylenically unsaturated bond, for example glycidyl (meth)acrylate, acryloyl glycidyl ether and itaconic acid monoalkyl glycidyl ether, etc., and also reaction products of carboxyl-containing polymeric compounds with compounds each containing a hydroxyl group and an ethylenically unsaturated bond (unsaturated alcohols), such as allyl alcohol, 2-buten-4-ol, alkyl alcohol, 2-hydroxyethyl (meth)acrylate, N-methylolacrylamide, etc.;
in addition, such binder resins may also contain unsaturated compounds having free isocyanate groups.

In general, the equivalents of unsaturation (molar mass of binder resin per unsaturated compound) of the binder resins mentioned are 200 to 3000, especially 230 to 1000, in order to achieve both sufficient photopolymerizability and hardness of the film. The acid value is generally 20 to 300, especially 40 to 200, in order to achieve sufficient alkali development capacity after the exposure of the film.

The mean molar mass of the binder resins for use is between 1500 and 200 000 and is especially 10 000 to 50 000 g/mol.

The organic solvents used in the inventive use of the pigment preparations for colour filters are, for example, ketones, alkylene glycol ethers, alcohols and aromatic compounds. Examples from the group of the ketones are: acetone, methyl ethyl ketone, cyclohexanone, etc.; from the group of the alkylene glycol ethers; Methyl Cellosolve (ethylene glycol monomethyl ether), Butyl Cellosolve (ethylene glycol monobutyl ether), Methyl Cellosolve Acetate, Ethyl Cellosolve Acetate, Butyl Cellosolve Acetate, ethylene glycol monopropyl ether, ethylene glycol monohexyl ether, ethylene glycol dimethyl ether, diethylene glycol ethyl ether, diethylene glycol diethyl ether, propylene glycol monomethyl ether, propylene glycol monoethyl ether, propylene glycol monopropyl ether, propylene glycol monobutyl ether, propylene glycol monomethyl ether acetate, diethylene glycol methyl ether acetate, diethylene glycol ethyl ether acetate, diethylene glycol propyl ether acetate, diethylene glycol isopropyl ether acetate, diethylene glycol butyl ether acetate, diethylene glycol t-butyl ether acetate, triethylene glycol methyl ether acetate, triethylene glycol ethyl ether acetate, triethylene glycol propyl ether acetate, triethylene glycol isopropyl ether acetate, triethylene glycol butyl ether acetate, triethylene glycol t-butyl ether acetate, etc.; from the group of the alcohols; methyl alcohol, ethyl alcohol, isopropyl alcohol, n-butyl alcohol, 3-methyl-3-methoxybutanol, etc.; from the group of the aromatic solvents: benzene, toluene, xylene, N-methyl-2-pyrrolidone, ethyl N-hydroxymethyl-2-acetate, etc.

Further other solvents are propane-1,2-diol diacetate, 3-methyl-3-methoxybutyl acetate, ethyl acetate, tetrahydrofuran, etc. The solvents may be used individually or in mixtures with one another.

The invention further relates to a photoresist comprising at least one metal azo pigment of the invention or at least one pigment preparation of the invention and at least one photocurable monomer and at least one photoinitiator.

The photocurable monomers contain at least one reactive double bond and optionally other reactive groups in the molecule.

Photocurable monomers are understood in this connection especially to mean reactive solvents or what are called reactive diluents, for example from the group of the mono-, di-, tri- and multifunctional acrylates and methacrylates, vinyl ethers and glycidyl ethers. Useful reactive groups additionally present include allyl, hydroxyl, phosphate, urethane, secondary amine and N-alkoxymethyl groups.

Monomers of this kind are known to those skilled in the art and are detailed, for example, in [*Römpp Lexikon, Lacke* and *Druckfarben, Dr. Ulrich Zorll, Thieme Verlag Stuttgart-New York*, 1998, p. 491/492].

The selection of monomers is guided especially by the nature and intensity of the radiation type used for the exposure, the desired reaction with the photoinitiator and the film properties. It is also possible to use combinations of monomers.

Reaction photoinitiators or photoinitiators are understood to mean compounds which form reactive intermediates as a result of the absorption of visible or ultraviolet radiation, which can trigger a polymerization reaction, for example of the abovementioned monomers and/or binder resins. Reaction photoinitiators are likewise commonly known and can likewise be found in [*Römpp Lexikon, Lacke sand Druckfarben, Dr. Ulrich Zorll, Thieme Verlag Stuttgart-New York*, 1998, p. 445/446].

According to the invention, there is no restriction with regard to the photocurable monomers or photoinitiators to be used.

The invention preferably relates to photoresists comprising
A) at least one metal azo pigment of the invention, especially in a mixture with other pigments, preferably C.I. Pigment Green 36 and/or Pigment Green 58 or a pigment preparation of the invention based thereon,
B1) at least one photocurable monomer,
B2) at least one photoinitiator,
C1) optionally an organic solvent,
D) optionally a dispersant,
E) optionally a binder resin,
and optionally further additions.

According to the invention, there is also no restriction with regard to the methodology for production of the coloured image element patterns based on the pigments or solid pigment preparations for use in accordance with the invention. As well as the above-described photolithographic method, other methods such as offset printing, chemical etching or inkjet printing are likewise suitable. The selection of the suitable binder resins and solvents and of pigment carrier media and further additions should be matched to the particular method. In the inkjet method, which is understood to mean both thermal and mechanical and piezo-mechanical inkjet printing, useful carrier media for the pigments and any hinder resins are not only purely organic but also aqueous-organic carrier media; aqueous-organic carrier media are actually preferred.

The examples which follow are intended to illustrate the present invention but without restricting it thereto.

EXAMPLES

Preparation of the Azobarbituric Acid Precursor (Method 1)

154.1 g of diazobarbituric acid and 128.1 g of barbituric acid were introduced into 3600 g distilled water at 85° C. Subsequently, aqueous potassium hydroxide solution was used to establish a pH of about 5 and the mixture was then stirred for 90 minutes.

Example 1

Preparation of Pigment 1

5000 g of distilled water were added at 82° C. to an azobarbituric acid prepared according to Method 1. Thereafter, 252.2 g of melamine were introduced. Subsequently, a mixture of 0.70 mol of an about 30% nickel(II) chloride solution, 0.05 mol of an about 30% zinc(II) chloride solution and 0.167 mol of an about 20% lanthanum(III) chloride solution was added dropwise. After 3 hours at 82° C., KOH was used to establish a pH of about 5.5. This was followed by dilution at 90° C. with about 1000 g of distilled water. Subsequently, 113 g of 30% hydrochloric acid were added dropwise and the mixture was heat-treated at 90° C. for 12 hours. Thereafter, aqueous potassium hydroxide solution was used to establish a pH of about 5. Subsequently, the pigment was isolated on a suction filter, washed and dried in a vacuum drying cabinet at 80° C., and ground in a standard laboratory mill for about 2 minutes. (=Pigment 1)

Examples 2 to 126

For preparation of inventive pigments 2 to 85 and of noninventive pigments 86 to 126, the procedure in each case was analogous to Example 1. In each case, 5000 g of distilled water were added at 82° C. to an azobarbituric acid prepared according to Method 1 and then 252.2 g of melamine were introduced. Subsequently, rather than the metal salt solution of Example 1, a metal salt solution as specified in the examples which follow was added dropwise in each case. The workup and isolation, drying and grinding of the respective pigment in all examples were analogous to the method specified in Example 1.

Example 2

Preparation of Pigment 2

A mixture of 0.50 mol of an about 30% nickel(II) chloride solution, 0.25 mol of an about 30% zinc(II) chloride solution and 0.167 mol of an about 20% cerium(III) chloride solution was added dropwise.

Example 3

Preparation of Pigment 3

A mixture of 0.30 mol of an about 30% nickel(II) chloride solution, 0.45 mol of an about 30% zinc(II) chloride solution and 0.167 mol of an about 20% praseodymium(III) chloride solution was added dropwise.

Example 4

Preparation of Pigment 4

A mixture of 0.05 mol of an about 30% nickel(II) chloride solution, 0.70 mol of an about 30% zinc(II) chloride solution and 0.167 mol of an about 20% neodymium(III) chloride solution was added dropwise.

Example 5

Preparation of Pigment 5

A mixture of 0.70 mol of an about 30% nickel(II) chloride solution, 0.05 mol of an about 30% zinc(II) chloride solution and 0.167 mol of an about 20% samarium(III) chloride solution was added dropwise.

Example 6

Preparation of Pigment 6

A mixture of 0.50 mol of an about 30% nickel(II) chloride solution, 0.25 mol of an about 30% zinc(II) chloride solution and 0.167 mol of an about 20% europium(III) chloride solution was added dropwise.

Example 7

Preparation of Pigment 7

A mixture of 0.30 mol of an about 30% nickel(II) chloride solution, 0.45 mol of an about 30% zinc(II) chloride solution and 0.167 mol of an about 20% gadolinium(III) chloride solution was added dropwise.

Example 8

Preparation of Pigment 8

A mixture of 0.05 mol of an about 30% nickel(II) chloride solution, 0.70 mol of an about 30% zinc(II) chloride solution and 0.167 mol of an about 20% terbium(III) chloride solution was added dropwise.

Example 9

Preparation of Pigment 9

A mixture of 0.70 mol of an about 30% nickel(II) chloride solution, 0.05 mol of an about 30% zinc(II) chloride solution and 0.167 mol of an about 20% dysprosium(III) chloride solution was added dropwise.

Example 10

Preparation of Pigment 10

A mixture of 0.50 mol of an about 30% nickel(II) chloride solution, 0.25 mol of an about 30% zinc(II) chloride solution and 0.167 mol of an about 20% holmium(III) chloride solution was added dropwise.

Example 11

Preparation of Pigment 11

A mixture of 0.30 mol of an about 30% nickel(II) chloride solution, 0.45 mol of an about 30% zinc(II) chloride solution and 0.167 mol of an about 20% erbium(III) chloride solution was added dropwise.

Example 12

Preparation of Pigment 12

A mixture of 0.05 mol of an about 30% nickel(II) chloride solution, 0.70 mol of an about 30% zinc(II) chloride solution and 0.167 mol of an about 20% thulium(III) chloride solution was added dropwise.

Example 13

Preparation of Pigment 13

A mixture of 0.70 mol of an about 30% nickel(II) chloride solution, 0.05 mol of an about 30% zinc(II) chloride solution and 0.167 mol of an about 20% ytterbium(III) chloride solution was added dropwise.

Example 14

Preparation of Pigment 14

A mixture of 0.50 mol of an about 30% nickel(II) chloride solution, 0.25 mol of an about 30% zinc(II) chloride solution and 0.25 mol of an about 20% strontium(II) chloride solution was added dropwise.

Example 15

Preparation of Pigment 15

A mixture of 0.30 mol of an about 30% nickel(II) chloride solution, 0.45 mol of an about 30% zinc(II) chloride solution and 0.25 mol of an about 20% magnesium(II) chloride solution was added dropwise.

Example 16

Preparation of Pigment 16

A mixture of 0.05 mol of an about 30% nickel(II) chloride solution, 0.70 mol of an about 30% zinc(II) chloride solution and 0.25 mol of an about 20% calcium(II) chloride solution was added dropwise.

Example 17

Preparation of Pigment 17

A mixture of 0.70 mol of an about 30% nickel(II) chloride solution, 0.05 mol of an about 30% zinc(II) chloride solution and 0.25 mol of an about 20% manganese(II) chloride solution was added dropwise.

Example 18

Preparation of Pigment 18

A mixture of 0.05 mol of an about 30% nickel(II) chloride solution, 0.80 mol of an about 30% zinc(II) chloride solution and 0.10 mol of an about 20% lanthanum(III) chloride solution was added dropwise.

Example 19

Preparation of Pigment 19

A mixture of 0.35 mol of an about 30% nickel(II) chloride solution, 0.50 mol of an about 30% zinc(II) chloride solution and 0.10 mol of an about 20% cerium(III) chloride solution was added dropwise.

Example 20

Preparation of Pigment 20

A mixture of 0.50 mol of an about 30% nickel(II) chloride solution, 0.35 mol of an about 30% zinc(II) chloride solution and 0.10 mol of an about 20% praseodymium(III) chloride solution was added dropwise.

Example 21

Preparation of Pigment 21

A mixture of 0.80 mol of an about 30% nickel(II) chloride solution, 0.05 mol of an about 30% zinc(II) chloride solution and 0.10 mol of an about 20% neodymium(III) chloride solution was added dropwise.

Example 22

Preparation of Pigment 22

A mixture of 0.05 mol of an about 30% nickel(II) chloride solution, 0.80 mol of an about 30% zinc(II) chloride solution and 0.10 mol of an about 20% samarium(III) chloride solution was added dropwise.

Example 23

Preparation of Pigment 23

A mixture of 0.35 mol of an about 30% nickel(II) chloride solution, 0.50 mol of an about 30% zinc(II) chloride solution and 0.10 mol of an about 20% europium(III) chloride solution was added dropwise.

Example 24

Preparation of Pigment 24

A mixture of 0.50 mol of an about 30% nickel(II) chloride solution, 0.35 mol of an about 30% zinc(II) chloride solution and 0.10 mol of an about 20% gadolinium(III) chloride solution was added dropwise.

Example 25

Preparation of Pigment 25

A mixture of 0.80 mol of an about 30% nickel(II) chloride solution, 0.05 mol of an about 30% zinc(II) chloride solution and 0.10 mol of an about 20% terbium(III) chloride solution was added dropwise.

Example 26

Preparation of Pigment 26

A mixture of 0.05 mol of an about 30% nickel(II) chloride solution, 0.80 mol of an about 30% zinc(II) chloride solution and 0.10 mol of an about 20% dysprosium(III) chloride solution was added dropwise.

Example 27

Preparation of Pigment 27

A mixture of 0.35 mol of an about 30% nickel(II) chloride solution, 050 mol of an about 30% zinc(II) chloride solution and 0.10 mol of an about 20% holmium(III) chloride solution was added dropwise.

Example 28

Preparation of Pigment 28

A mixture of 0.50 mol of an about 30% nickel(II) chloride solution, 0.35 mol of an about 30% zinc(II) chloride solution and 0.10 mol of an about 20% erbium(III) chloride solution was added dropwise.

Example 29

Preparation of Pigment 29

A mixture of 0.80 mol of an about 30% nickel(II) chloride solution, 0.05 mol of an about 30% zinc(II) chloride solution and 0.10 mol of an about 20% thulium(III) chloride solution was added dropwise.

Example 30

Preparation of Pigment 30

A mixture of 0.05 mol of an about 30% nickel(II) chloride solution, 0.80 mol of an about 30% zinc(II) chloride solution and 0.10 mol of an about 20% ytterbium(III) chloride solution was added dropwise.

Example 31

Preparation of Pigment 31

A mixture of 0.35 mol of an about 30% nickel(II) chloride solution, 0.50 mol of an about 30%. zinc(II) chloride solution and 0.15 mol of an about 20% strontium(II) chloride solution was added dropwise.

Example 32

Preparation of Pigment 32

A mixture of 0.50 mol of an about 30% nickel(II) chloride solution, 0.35 mol of an about 30% zinc(II) chloride solution and 0.15 mol of an about 20% magnesium(III) chloride solution was added dropwise.

Example 33

Preparation of Pigment 33

A mixture of 0.80 mol of an about 30% nickel(II) chloride solution, 0.05 mol of an about 30% zinc(II) chloride solution and 0.15 mol of an about 20% calcium(II) chloride solution was added dropwise.

Example 34

Preparation of Pigment 34

A mixture of 0.50 mol of an about 30% nickel(II) chloride solution, 0.35 mol of an about 30% zinc(II) chloride solution and 0.15 mol of an about 20% manganese(II) chloride solution was added dropwise.

Example 35

Preparation of Pigment 35

A mixture of 0.33 mol of an about 30% nickel(II) chloride solution, 0.60 mol of an about 30% zinc(II) chloride solution and 0.047 mol of an about 20% lanthanum(III) chloride solution was added dropwise.

Example 36

Preparation of Pigment 36

A mixture of 0.90 mol of an about 30% nickel(II) chloride solution, 0.03 mol of an about 30% zinc(II) chloride solution and 0.047 mol of an about 20% cerium(III) chloride solution was added dropwise.

Example 37

Preparation of Pigment 37

A mixture of 0.60 mol of an about 30% nickel(II) chloride solution, 0.33 mol of an about 30% zinc(II) chloride solution and 0.047 mol of an about 20% praseodymium(III) chloride solution was added dropwise.

Example 38

Preparation of Pigment 38

A mixture of 0.33 mol of an about 30% nickel(II) chloride solution, 0.60 mol of an about 30% zinc(II) chloride solution and 0.047 mol of an about 20% neodymium(III) chloride solution was added dropwise.

Example 39

Preparation of Pigment 39

A mixture of 0.03 mol of an about 30% nickel(II) chloride solution, 0.90 mol of an about 30% zinc(II) chloride solution and 0.047 mol of an about 20% samarium(III) chloride solution was added dropwise.

Example 40

Preparation of Pigment 40

A mixture of 0.90 mol of an about 30% nickel(II) chloride solution, 0.03 mol of an about 30% zinc(II) chloride solution and 0.047 mol of an about 20% europium(III) chloride solution was added dropwise.

Example 41

Preparation of Pigment 41

A mixture of 0.60 mol of an about 30% nickel(II) chloride solution, 0.33 mol of an about 30% zinc(II) chloride solution and 0.047 mol of an about 20% gadolinium(III) chloride solution was added dropwise.

Example 42

Preparation of Pigment 42

A mixture of 0.33 mol of an about 30% nickel(II) chloride solution, 0.60 mol of an about 30% zinc(II) chloride solution and 0.047 mol of an about 20% terbium(III) chloride solution was added dropwise.

Example 43

Preparation of Pigment 43

A mixture of 0.03 mol of an about 30% nickel(II) chloride solution, 0.90 mol of an about 30% zinc(II) chloride solution and 0.047 mol of an about 20% dysprosium(III) chloride solution was added dropwise.

Example 44

Preparation of Pigment 44

A mixture of 0.90 mol of an about 30% nickel(II) chloride solution, 0.03 mol of an about 30% zinc(II) chloride solution and 0.047 mol of an about 20% holmium(III) chloride solution was added dropwise.

Example 45

Preparation of Pigment 45

A mixture of 0.60 mol of an about 30% nickel(II) chloride solution, 0.33 mol of an about 30% zinc(II) chloride solution and 0.047 mol of an about 20% erbium(III) chloride solution was added dropwise.

Example 46

Preparation of Pigment 46

A mixture of 0.33 mol of an about 30% nickel(II) chloride solution, 0.60 mol of an about 30% zinc(II) chloride solution and 0.047 mol of an about 20% thulium(III) chloride solution was added dropwise.

Example 47

Preparation of Pigment 47

A mixture of 0.03 mol of an about 30% nickel(II) chloride solution, 0.90 mol of an about 30% zinc(II) chloride solution and 0.047 mol of an about 20% ytterbium(III) chloride solution was added dropwise.

Example 48

Preparation of Pigment 48

A mixture of 0.90 mol of an about 30% nickel(II) chloride solution, 0.03 mol of an about 30% zinc(II) chloride solution and 0.07 mol of an about 20% strontium(II) chloride solution was added dropwise.

Example 49

Preparation of Pigment 49

A mixture of 0.60 mol of an about 30% nickel(II) chloride solution, 0.33 mol of an about 30% zinc(II) chloride solution and 0.07 mol of an about 20% magnesium(II) chloride solution was added dropwise.

Example 50

Preparation of Pigment 50

A mixture of 0.33 mol of an about 30% nickel(II) chloride solution, 0.60 mol of an about 30% zinc(II) chloride solution and 0.07 mol of an about 20% calcium(II) chloride solution was added dropwise.

Example 51

Preparation of Pigment 51

A mixture of 0.03 mol of an about 30% nickel(II) chloride solution, 0.90 mol of an about 30% zinc(II) chloride solution and 0.07 mol of an about 20% manganese(II) chloride solution was added dropwise.

Example 52

Preparation of Pigment 52

A mixture of 0.37 mol of an about 30% nickel(II) chloride solution, 0.60 mol of an about 30% zinc(II) chloride solution and 0.020 mol of an about 20% lanthanum(III) chloride solution was added dropwise.

Example 53

Preparation of Pigment 53

A mixture of 0.05 mol of an about 30% nickel(II) chloride solution, 0.90 mol of an about 30% zinc(II) chloride solution and 0.020 mol of an about 20% cerium(III) chloride solution was added dropwise.

Example 54

Preparation of Pigment 54

A mixture of 0.92 mol of an about 30% nickel(II) chloride solution, 0.05 mol of an about 30% zinc(II) chloride solution and 0.020 mol of an about 20% praseodymium(III) chloride solution was added dropwise.

Example 55

Preparation of Pigment 55

A mixture of 0.60 mol of an about 30% nickel(II) chloride solution, 0.37 mol of an about 30% zinc(II) chloride solution and 0.020 mol of an about 20% neodymium(III) chloride solution was added dropwise.

Example 56

Preparation of Pigment 56

A mixture of 0.37 mol of an about 30% nickel(II) chloride solution, 0.60 mol of an about 30% zinc(II) chloride solution and 0.020 mol of an about 20% samarium(III) chloride solution was added dropwise.

Example 57

Preparation of Pigment 57

A mixture of 0.05 mol of an about 30% nickel(II) chloride solution, 0.92 mol of an about 30% zinc(II) chloride solution and 0.020 mol of an about 20% europium(III) chloride solution was added dropwise.

Example 58

Preparation of Pigment 58

A mixture of 0.92 mol of an about 30% nickel(II) chloride solution, 0.05 mol of an about 30% zinc(II) chloride solution and 0.020 mol of an about 20% gadolinium(III) chloride solution was added dropwise.

Example 59

Preparation of Pigment 59

A mixture of 0.60 mol of an about 30% nickel(II) chloride solution, 0.37 mol of an about 30% zinc(II) chloride solution and 0.020 mol of an about 20% terbium(III) chloride solution was added dropwise.

Example 60

Preparation of Pigment 60

A mixture of 0.37 mol of an about 30% nickel(II) chloride solution, 0.60 mol of an about 30% zinc(II) chloride solution and 0.020 mol of an about 20% dysprosium(III) chloride solution was added dropwise.

Example 61

Preparation of Pigment 61

A mixture of 0.05 mol of an about 30% nickel(II) chloride solution, 0.92 mol of an about 30% zinc(II) chloride solution and 0.020 mol of an about 20% holmium(III) chloride solution was added dropwise.

Example 62

Preparation of Pigment 62

A mixture of 0.92 mol of an about 30% nickel(II) chloride solution, 0.05 mol of an about 30% zinc(II) chloride solution and 0.020 mol of an about 20% erbium(III) chloride solution was added dropwise.

Example 63

Preparation of Pigment 63

A mixture of 0.60 mol of an about 30% nickel(II) chloride solution, 0.37 mol of an about 30% zinc(II) chloride solution and 0.020 mol of an about 20% thulium(III) chloride solution was added dropwise.

Example 64

Preparation of Pigment 64

A mixture of 0.37 mol of an about 30% nickel(II) chloride solution, 0.60 mol of an about 30% zinc(II) chloride solution and 0.020 mol of an about 20% ytterbium(III) chloride solution was added dropwise.

Example 65

Preparation of Pigment 65

A mixture of 0.05 mol of an about 30% nickel(II) chloride solution, 0.92 mol of an about 30% zinc(II) chloride solution and 0.030 mol of an about 20% strontium(II) chloride solution was added dropwise.

Example 66

Preparation of Pigment 66

A mixture of 0.92 mol of an about 30% nickel(II) chloride solution, 0.05 mol of an about 30% zinc(II) chloride solution and 0.030 mol of an about 20% magnesium(II) chloride solution was added dropwise.

Example 67

Preparation of Pigment 67

A mixture of 0.60 mol of an about 30% nickel(II) chloride solution, 0.37 mol of an about 30% zinc(II) chloride solution and 0.030 mol of an about 20% calcium(II) chloride solution was added dropwise.

Example 68

Preparation of Pigment 68

A mixture of 0.37 mol of an about 30% nickel(II) chloride solution, 0.60 mol of an about 30% zinc(II) chloride solution and 0.030 mol of an about 20% manganese(II) chloride solution was added dropwise.

Example 69

Preparation of Pigment 69

A mixture of 0.95 mol of an about 30% nickel(II) chloride solution, 0.045 mol of an about 30% zinc(II) chloride solution and 0.0033 mol of an about 20% lanthanum(III) chloride solution was added dropwise.

Example 70

Preparation of Pigment 70

A mixture of 0.60 mol of an about 30% nickel(II) chloride solution, 0.395 mol of an about 30% zinc(II) chloride solution and 0.0033 mol of an about 20% cerium(III) chloride solution was added dropwise.

Example 71

Preparation of Pigment 71

A mixture of 0395 mol of an about 30% nickel(II) chloride solution, 0.60 mol of an about 30% zinc(II) chloride solution and 0.0033 mol of an about 20% praseodymium(III) chloride solution was added dropwise.

Example 72

Preparation of Pigment 72

A mixture of 0.045 mol of an about 30% nickel(II) chloride solution, 0.95 mol of an about 30% zinc(II) chloride solution and 0.0033 mol of an about 20% neodymium(III) chloride solution was added dropwise.

Example 73

Preparation of Pigment 73

A mixture of 0.95 mol of an about 30% nickel(II) chloride solution, 0.045 mol of an about 30% zinc(II) chloride solution and 0.0033 mol of an about 20% samarium(III) chloride solution was added dropwise.

Example 74

Preparation of Pigment 74

A mixture of 0.60 mol of an about 30% nickel(II) chloride solution, 0.395 mol of an about 30% zinc(II) chloride solution and 0.0033 mol of an about 20% europium(III) chloride solution was added dropwise.

Example 75

Preparation of Pigment 75

A mixture of 0.395 mol of an about 30% nickel(II) chloride solution, 0.60 mol of an about 30% zinc(II) chloride solution and 0.0033 mol of an about 20% gadolinium(III) chloride solution was added dropwise.

Example 76

Preparation of Pigment 76

A mixture of 0.045 mol of an about 30% nickel(II) chloride solution, 0.95 mol of an about 30% zinc(II) chloride solution and 0.0033 mol of an about 20% terbium(III) chloride solution was added dropwise.

Example 77

Preparation of Pigment 77

A mixture of 0.95 mol of an about 30% nickel(II) chloride solution, 0.045 mol of an about 30% zinc(II) chloride solution and 0.0033 mol of an about 20% dysprosium(III) chloride solution was added dropwise.

Example 78

Preparation of Pigment 78

A mixture of 0.60 mol of an about 30% nickel(II) chloride solution, 0.395 mol of an about 30% zinc(II) chloride solution and 0.0033 mol of an about 20% holmium(III) chloride solution was added dropwise.

Example 79

Preparation of Pigment 79

A mixture of 0.395 mol of an about 30% nickel(II) chloride solution, 0.60 mol of an about 30% zinc(II) chloride solution and 0.0033 mol of an about 20% erbium(III) chloride solution was added dropwise.

Example 80

Preparation of Pigment 80

A mixture of 0.045 mol of an about 30% nickel(II) chloride solution, 0.95 mol of an about 30% zinc(II) chloride solution and 0.0033 mol of an about 20% thulium(III) chloride solution was added dropwise.

Example 81

Preparation of Pigment 81

A mixture of 0.95 mol of an about 30% nickel(II) chloride solution, 0.045 mol of an about 30% zinc(II) chloride solution and 0.0033 mol of an about 20% ytterbium(III) chloride solution was added dropwise.

Example 82

Preparation of Pigment 82

A mixture of 0.60 mol of an about 30% nickel(II) chloride solution, 0.395 mol of an about 30% zinc(II) chloride solution and 0.0050 mol of an about 20% strontium(II) chloride solution was added dropwise.

Example 83

Preparation of Pigment 83

A mixture of 0.395 mol of an about 30% nickel(II) chloride solution, 0.60 mol of an about 30% zinc(II) chloride solution and 0.0050 mol of an about 20% magnesium(II) chloride solution was added dropwise.

Example 84

Preparation of Pigment 84

A mixture of 0.045 mol of an about 30% nickel(II) chloride solution, 0.94 mol of an about 30% zinc(II) chloride solution and 0.0050 mol of an about 20% calcium(II) chloride solution was added dropwise.

Example 85

Preparation of Pigment 85

A mixture of 0.395 mol of an about 30% nickel(II) chloride solution, 0.60 mol of an about 30% zinc(II) chloride solution and 0.0050 mol of an about 20% manganese(II) chloride solution was added dropwise.

Example 86

Preparation of Pigment 86 (Noninventive)

A mixture of 0.60 mol of an about 30% nickel(II) chloride solution, 0.05 mol of an about 30% zinc(II) chloride solution and 0.233 mol of an about 20% lanthanum(III) chloride solution was added dropwise.

Example 87

Preparation of Pigment 87 (Noninventive)

A mixture of 0.40 mol of an about 30% nickel(II) chloride solution, 0.25 mol of an about 30% zinc(II) chloride solution and 0.233 mol of an about 20% cerium(III) chloride solution was added dropwise.

Example 88

Preparation of Pigment 88 (Noninventive)

A mixture of 0.25 mol of an about 30% nickel(II) chloride solution, 0.40 mol of an about 30% zinc(II) chloride solution and 0.233 mol of an about 20% praseodymium(III) chloride solution was added dropwise.

Example 89

Preparation of Pigment 89 (Noninventive)

A mixture of 0.05 mol of an about 30% nickel(II) chloride solution, 0.60 mol of an about 30% zinc(II) chloride solution and 0.233 mol of an about 20% neodymium(III) chloride solution was added dropwise.

Example 90

Preparation of Pigment 90 (Noninventive)

A mixture of 0.60 mol of an about 30% nickel(II) chloride solution, 0.05 mol of an about 30% zinc(II) chloride solution and 0.233 mol of an about 20% samarium(III) chloride solution was added dropwise.

Example 91

Preparation or Pigment 91 (Noninventive)

A mixture of 0.40 mol of an about 30% nickel(II) chloride solution, 0.25 mol of an about 30% zinc(II) chloride solution and 0.233 mol of an about 20% europium(III) chloride solution was added dropwise.

Example 92

Preparation of Pigment 92 (Noninventive)

A mixture of 0.25 mol of an about 30% nickel(II) chloride solution, 0.40 mol of an about 30% zinc(II) chloride solution and 0.233 mol of an about 20% gadolinium(III) chloride solution was added dropwise.

Example 93

Preparation of Pigment 93 (Noninventive)

A mixture of 0.05 mol of an about 30% nickel(II) chloride solution, 0.60 mol of an about 30% zinc(II) chloride solution and 0.233 mol of an about 20% terbium(III) chloride solution was added dropwise.

Example 94

Preparation of Pigment 94 (Noninventive)

A mixture of 0.60 mol of an about 30% nickel(II) chloride solution, 0.05 mol of an about 30% zinc(II) chloride solution and 0.233 mol of an about 20% dysprosium(III) chloride solution was added dropwise.

Example 95

Preparation of Pigment 95 (Noninventive)

A mixture of 0.40 mol of an about 30% nickel(II) chloride solution, 0.25 mol of an about 30% zinc(II) chloride solution and 0.233 mol of an about 20% holmium(III) chloride solution was added dropwise.

Example 96

Preparation of Pigment 96 (Noninventive)

A mixture of 0.25 mol of an about 30% nickel(II) chloride solution, 0.40 mol of an about 30% zinc(II) chloride solution and 0.233 mol of an about 20% erbium(III) chloride solution was added dropwise.

Example 97

Preparation of Pigment 97 (Noninventive)

A mixture of 0.05 mol of an about 30% nickel(II) chloride solution, 0.60 mol of an about 30% zinc(II) chloride solution and 0.233 mol of an about 20% thulium(III) chloride solution was added dropwise.

Example 98

Preparation of Pigment 98 (Noninventive)

A mixture of 0.60 mol of an about 30% nickel(II) chloride solution, 0.05 mol of an about 30% zinc(II) chloride solution and 0.233 mol of an about 20% ytterbium(III) chloride solution was added dropwise.

Example 99

Preparation of Pigment 99 (Noninventive)

A mixture of 0.40 mol of an about 30% nickel(II) chloride solution, 0.25 mol of an about 30% zinc(II) chloride solution and 0.35 mol of an about 20% strontium(II) chloride solution was added dropwise.

Example 100

Preparation of Pigment 100 (Noninventive)

A mixture of 0.25 mol of an about 30% nickel(II) chloride solution, 0.40 mol of an about 30% zinc(II) chloride solution and 0.35 mol of an about 20% magnesium(II) chloride solution was added dropwise.

Example 101

Preparation of Pigment 101 (Noninventive)

A mixture of 0.05 mol of an about 30% nickel(II) chloride solution, 0.60 mol of an about 30% zinc(II) chloride solution and 0.35 mol of an about 20% calcium(II) chloride solution was added dropwise.

Example 102

Preparation of Pigment 102 (Noninventive)

A mixture of 0.60 mol of an about 30% nickel(II) chloride solution, 0.05 mol of an about 30% zinc(II) chloride solution and 0.35 mol of an about 20% manganese(II) chloride solution was added dropwise.

Example 103

Preparation of Pigment 103 (Noninventive)

A mixture of 0.933 mol of an about 30% nickel(II) chloride solution and 0.067 mol of an about 30% zinc(II) chloride solution was added dropwise.

Example 104

Preparation of Pigment 104 (Noninventive)

A mixture of 0.666 mol of an about 30% nickel(II) chloride solution and 0.333 mol of an about 30% zinc(II) chloride solution was added dropwise.

Example 105

Preparation of Pigment 105 (Noninventive)

A mixture of 0.401 mol of an about 30% nickel(II) chloride solution and 0.599 mol of an about 30% zinc(II) chloride solution was added dropwise.

Example 106

Preparation of Pigment 106 (Noninventive)

A mixture of 0.065 mol of an about 30% nickel(II) chloride solution and 0.935 mol of an about 30% zinc(II) chloride solution was added dropwise.

Example 107

Preparation of Pigment 107 (Noninventive)

A mixture of 0.059 mol of an about 30% nickel(II) chloride solution and 0.941 mol of an about 30% zinc(II) chloride solution was added dropwise.

Example 108

Preparation of Pigment 108 (Noninventive)

A mixture of 0.412 mol of an about 30% nickel(II) chloride solution and 0.588 mol of an about 30% zinc(II) chloride solution was added dropwise.

Example 109

Preparation of Pigment 109 (Noninventive)

A mixture of 0.588 mol of an about 30% nickel(II) chloride solution and 0.412 mol of an about 30% zinc(II) chloride solution was added dropwise.

Example 110

Preparation of Pigment 110 (Noninventive)

A mixture of 0.941 mol of an about 30% nickel(II) chloride solution and 0.059 mol of an about 30% zinc(II) chloride solution was added dropwise.

Example 111

Preparation of Pigment 111 (Noninventive)

A mixture of 0.963 mol of an about 30% nickel(II) chloride solution and 0.032 mol of an about 30% zinc(II) chloride solution was added dropwise.

Example 112

Preparation of Pigment 112 (Noninventive)

A mixture of 0.644 mol of an about 30% nickel(II) chloride solution and 0.356 mol of an about 30% zinc(II) chloride solution was added dropwise.

Example 113

Preparation of Pigment 113 (Noninventive)

A mixture of 0.355 mol of an about 30% nickel(II) chloride solution and 0.645 mol of an about 30% zinc(II) chloride solution was added dropwise.

Example 114

Preparation of Pigment 114 (Noninventive)

A mixture of 0.032 mol of an about 30% nickel(II) chloride solution and 0.968 mol of an about 30% zinc(II) chloride solution was added dropwise.

Example 115

Preparation of Pigment 115 (Noninventive)

A mixture of 0.051 mol of an about 30% nickel(II) chloride solution and 0.949 mol of an about 30% zinc(II) chloride solution was added dropwise.

Example 116

Preparation of Pigment 116 (Noninventive)

A mixture of 0.948 mol of an about 30% nickel(II) chloride solution and 0.052 mol of an about 30% zinc(II) chloride solution was added dropwise.

Example 117

Preparation of Pigment 117 (Noninventive)

A mixture of 0.618 mol of an about 30% nickel(II) chloride solution and 0.382 mol of an about 30% zinc(II) chloride solution was added dropwise.

Example 118

Preparation of Pigment 118 (Noninventive)

A mixture of 0.383 mol of an about 30% nickel(II) chloride solution and 0.617 mol of an about 30% zinc(II) chloride solution was added dropwise.

Example 119

Preparation of Pigment 119 (Noninventive)

A mixture of 0.955 mol of an about 30% nickel(II) chloride solution and 0.045 mol of an about 30% zinc(II) chloride solution was added dropwise.

Example 120

Preparation of Pigment 120 (Noninventive)

A mixture of 0.603 mol of an about 30% nickel(II) chloride solution and 0.397 mol of an about 30% zinc(II) chloride solution was added dropwise.

Example 121

Preparation of Pigment 121 (Noninventive)

A mixture of 0.398 mol of an about 30% nickel(II) chloride solution and 0.602 mol of an about 30% zinc(II) chloride solution was added dropwise.

Example 121

Preparation of Pigment 121 (Noninventive)

A mixture of 0.398 mol of an about 30% nickel(II) chloride solution and 0.602 mol of an about 30% zinc(II) chloride solution was added dropwise.

Example 122

Preparation of Pigment 122 (Noninventive)

A mixture of 0.045 mol of an about 30% nickel(II) chloride solution and 0.955 mol of an about 30% zinc(II) chloride solution was added dropwise.

Example 123

Preparation of Pigment 123 (Noninventive)

A mixture of 0.923 mol of an about 30% nickel(II) chloride solution and 0.077 mol of an about 30% zinc(II) chloride solution was added dropwise.

Example 124

Preparation of Pigment 124 (Noninventive)

A mixture of 0.615 mol of an about 30% nickel(II) chloride solution and 0.385 mol of an about 30% zinc(II) chloride solution was added dropwise.

Example 125

Preparation of Pigment 125 (Noninventive)

A mixture of 0.618 mol of an about 30% nickel(II) chloride solution and 0.382 mol of an about 30% zinc(II) chloride solution was added dropwise.

Example 126

Preparation of Pigment 126 (Noninventive)

A mixture of 0.077 mol of an about 30% nickel(II) chloride solution and 0.923 mol of an about 30% zinc(II) chloride solution was added dropwise.

Determination of Colour Strength in PVC

The pigments 1 to 126 prepared according to Examples 1 to 126 were each subjected to a determination of colour strength by the method which follows. The results are listed in Table 1.

The test medium produced was a flexible PVC compound, by homogenizing 67.5% Vestolit® E7004 (Vestolit GmbH), 29.0% Hexamoll® Dinch (BASF), 2.25% Baerostab UBZ 770 (Baerlocher GmbH) and 1.25% Isocolor white pigment paste (ISL-Chemie) with a laboratory dissolver.

A laboratory roll mill was used to add 100 g of the PVC compound at 150° C. to two rollers of diameter 150 mm that rotate at 20 min$^{-1}$ and 18 min$^{-1}$. Together with 0.10 g of pigment, the milled sheet that formed was guided through a roller gap of 0.10 mm eight times. Then the homogeneously coloured milled sheet was removed with a roller gap of 0.8 mm and laid out flat over a metal surface. The cooled milled sheet was then passed through a roller gap of 0.2 mm between two unheated rollers of diameter 110 mm that rotate at 26 min$^{-1}$ and 24 min$^{-1}$ eight times. To smooth the surface, this milled sheet was applied to the rollers at 150° C. once again, removed at 0.8 mm and left to cool on a smooth surface. Specimens of this sheet served to determine the relative colour strength.

The relative colour strength was calculated after measuring the reflectance of the specimens against a white background by means of a spectrophotometer with d/8 measurement geometry under D65 illuminant with a 10° observer according to DIN 55986 using the sum total of the K/S values over the visible spectrum (400 nm-700 mm).

TABLE 1

| Sample | Status | Molar Ni/Zn ratio | Colour strength % |
|---|---|---|---|
| Pigment 1: | inventive | 14:1 | 114 |
| Pigment 2: | inventive | 2:1 | 115 |
| Pigment 3: | inventive | 0.67:1 | 114 |
| Pigment 4: | inventive | 0.07:1 | 113 |
| Pigment 5: | inventive | 14:1 | 115 |
| Pigment 6: | inventive | 2:1 | 114 |
| Pigment 7: | inventive | 0.67:1 | 113 |
| Pigment 8: | inventive | 0.07:1 | 113 |
| Pigment 9: | inventive | 14:1 | 115 |
| Pigment 10: | inventive | 2:1 | 114 |
| Pigment 11: | inventive | 0.67:1 | 113 |
| Pigment 12: | inventive | 0.07:1 | 115 |
| Pigment 13: | inventive | 14:1 | 112 |
| Pigment 14: | inventive | 2:1 | 111 |
| Pigment 15: | inventive | 0.67:1 | 115 |
| Pigment 16: | inventive | 0.07:1 | 116 |
| Pigment 17: | inventive | 14:1 | 115 |
| Pigment 18: | inventive | 0.063:1 | 126 |
| Pigment 19: | inventive | 0.7:1 | 127 |
| Pigment 20: | inventive | 1.43:1 | 128 |
| Pigment 21: | inventive | 16:1 | 125 |
| Pigment 22: | inventive | 0.063:1 | 125 |
| Pigment 23: | inventive | 0.7:1 | 124 |
| Pigment 24: | inventive | 1.43:1 | 122 |
| Pigment 25: | inventive | 16:1 | 120 |
| Pigment 26: | inventive | 0.063:1 | 122 |
| Pigment 27: | inventive | 0.7:1 | 125 |
| Pigment 28: | inventive | 1.43:1 | 121 |
| Pigment 29: | inventive | 16:1 | 124 |
| Pigment 30 | inventive | 0.063:1 | 120 |
| Pigment 31: | inventive | 0.7:1 | 122 |
| Pigment 32: | inventive | 1.43:1 | 123 |
| Pigment 33: | inventive | 16:1 | 122 |
| Pigment 34 | inventive | 1.43:1 | 121 |
| Pigment 35: | inventive | 0.55:1 | 115 |
| Pigment 36: | inventive | 30:1 | 114 |
| Pigment 37: | inventive | 1.82:1 | 115 |
| Pigment 38: | inventive | 0.55:1 | 115 |
| Pigment 39: | inventive | 0.033:1 | 114 |
| Pigment 40: | inventive | 30:1 | 111 |
| Pigment 41: | inventive | 1.82:1 | 115 |
| Pigment 42: | inventive | 0.55:1 | 116 |
| Pigment 43: | inventive | 0.033:1 | 117 |
| Pigment 44: | inventive | 30:1 | 115 |
| Pigment 45: | inventive | 1.82:1 | 113 |
| Pigment 46: | inventive | 0.55:1 | 114 |
| Pigment 47: | inventive | 0.033:1 | 116 |
| Pigment 48: | inventive | 30:1 | 112 |
| Pigment 49: | inventive | 1.82:1 | 111 |
| Pigment 50: | inventive | 0.55:1 | 113 |
| Pigment 51: | inventive | 0.033:1 | 112 |
| Pigment 52: | inventive | 0.62:1 | 109 |
| Pigment 53: | inventive | 0.054:1 | 108 |
| Pigment 54: | inventive | 18.4:1 | 107 |
| Pigment 55: | inventive | 1.62:1 | 108 |
| Pigment 56: | inventive | 0.62:1 | 109 |
| Pigment 57: | inventive | 0.054:1 | 108 |
| Pigment 58: | inventive | 18.4:1 | 107 |
| Pigment 59: | inventive | 1.62:1 | 109 |
| Pigment 60: | inventive | 0.62:1 | 108 |
| Pigment 61: | inventive | 0.054:1 | 110 |
| Pigment 62: | inventive | 18.4:1 | 109 |
| Pigment 63: | inventive | 1.62:1 | 108 |
| Pigment 64: | inventive | 0.62:1 | 107 |
| Pigment 65: | inventive | 0.054:1 | 109 |
| Pigment 66: | inventive | 18.4:1 | 107 |
| Pigment 67: | inventive | 1.62:1 | 108 |
| Pigment 68: | inventive | 0.62:1 | 107 |
| Pigment 69: | inventive | 21.1:1 | 106 |
| Pigment 70: | inventive | 1.52:1 | 105 |
| Pigment 71: | inventive | 0.66:1 | 104 |
| Pigment 72: | inventive | 0.047:1 | 103 |
| Pigment 73: | inventive | 21.1:1 | 104 |
| Pigment 74: | inventive | 1.52:1 | 105 |
| Pigment 75: | inventive | 0.66:1 | 105 |
| Pigment 76: | inventive | 0.047:1 | 105 |
| Pigment 77: | inventive | 21.1:1 | 104 |
| Pigment 78: | inventive | 1.52:1 | 102 |
| Pigment 79: | inventive | 0.66:1 | 103 |
| Pigment 80: | inventive | 0.047:1 | 106 |
| Pigment 81: | inventive | 21.1:1 | 105 |
| Pigment 82: | inventive | 1.52:1 | 103 |
| Pigment 83: | inventive | 0.66:1 | 105 |
| Pigment 84: | inventive | 0.047:1 | 103 |
| Pigment 85: | inventive | 0.66:1 | 105 |
| Pigment 86: | noninventive | 12:1 | 99 |
| Pigment 87: | noninventive | 1.6:1 | 98 |
| Pigment 88: | noninventive | 0.63:1 | 97 |
| Pigment 89: | noninventive | 0.083:1 | 99 |
| Pigment 90: | noninventive | 12:1 | 95 |
| Pigment 91: | noninventive | 1.6:1 | 94 |
| Pigment 92: | noninventive | 0.63:1 | 98 |
| Pigment 93: | noninventive | 0.083:1 | 99 |
| Pigment 94: | noninventive | 12:1 | 97 |
| Pigment 95: | noninventive | 1.6:1 | 96 |
| Pigment 96: | noninventive | 0.63:1 | 95 |

TABLE 1-continued

| Sample | Status | Molar Ni/Zn ratio | Colour strength % |
|---|---|---|---|
| Pigment 97: | noninventive | 0.083:1 | 98 |
| Pigment 98: | noninventive | 12:1 | 99 |
| Pigment 99: | noninventive | 1.6:1 | 96 |
| Pigment 100: | noninventive | 0.63:1 | 97 |
| Pigment 101: | noninventive | 0.083:1 | 98 |
| Pigment 102: | noninventive | 12:1 | 96 |
| Pigment 103: | noninventive | 14:1 | 100 |
| Pigment 104: | noninventive | 2:1 | 100 |
| Pigment 105: | noninventive | 0.67:1 | 100 |
| Pigment 106: | noninventive | 0.07:1 | 100 |
| Pigment 107: | noninventive | 0.063:1 | 100 |
| Pigment 108: | noninventive | 0.7:1 | 100 |
| Pigment 109: | noninventive | 1.43:1 | 100 |
| Pigment 110: | noninventive | 16:1 | 100 |
| Pigment 111: | noninventive | 30:1 | 100 |
| Pigment 112: | noninventive | 1.82:1 | 100 |
| Pigment 113: | noninventive | 0.55:1 | 100 |
| Pigment 114: | noninventive | 0.033:1 | 100 |
| Pigment 115: | noninventive | 0.054:1 | 100 |
| Pigment 116: | noninventive | 18.4:1 | 100 |
| Pigment 117: | noninventive | 1.62:1 | 100 |
| Pigment 118: | noninventive | 0.62:1 | 100 |
| Pigment 119: | noninventive | 21:1 | 100 |
| Pigment 120: | noninventive | 1.52:1 | 100 |
| Pigment 121: | noninventive | 0.66:1 | 100 |
| Pigment 122: | noninventive | 0.047:1 | 100 |
| Pigment 123: | noninventive | 12:1 | 100 |
| Pigment 124: | noninventive | 1.6:1 | 100 |
| Pigment 125: | noninventive | 0.63:1 | 100 |
| Pigment 126: | noninventive | 0.083:1 | 100 |

Conclusion: It is apparent from Table 1 that all inventive pigments have elevated colour strengths compared to the noninventive pigments, which do have the same molar Ni/Zn ratio as the inventive pigments but are exclusively binary mixtures. This means that the inventive pigments, based on equal starting weights, attain higher optical densities than the noninventive pigments.

What is claimed is:

1. Metal azo pigments comprising:
a) at least three metal azo compounds which differ at least in the type of metal and which each contain structural units of the formula (I), or the tautomeric forms thereof,

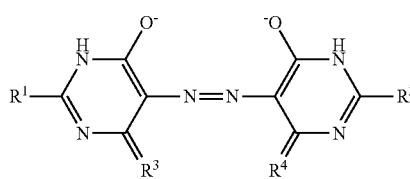

in which
R$^1$ and R$^2$ are each independently OH, NH$_2$ or NHR$^5$,
R$^3$ and R$^4$ are each independently =O or =NR$^5$,
R$^5$ is hydrogen or alkyl, and
Ni$^{2+}$ and Zn$^{2+}$ ions and at least one further metal ion Me, where
Me is a di- or trivalent metal ion selected from the group consisting of La$^{3+}$, Ce$^{3+}$, Pr$^{3+}$, Nd$^{2+}$, Nd$^{3+}$, Sm$^{2+}$, Sm$^{3+}$, Eu$^{2+}$, Eu$^{3+}$, Gd$^{3+}$, Tb$^{3+}$, Dy$^{3+}$, Ho$^{3+}$, Er$^{3+}$, Tm$^{3+}$, Yb$^{2+}$, Yb$^{3+}$, Mg$^{2+}$, Ca$^{2+}$, Sr$^{2+}$, Ba$^{2+}$, Sc$^{3+}$, Y$^{3+}$, Ti$^{2+}$, Ti$^{3+}$, Zr$^{2+}$, Zr$^{3+}$, V$^{2+}$, V$^{3+}$, Nb$^{3+}$, Cr$^{3+}$, Mo$^{2+}$, Mo$^{3+}$, Mn$^{2+}$, Cd$^{2+}$ and Pb$^{2+}$, with the proviso that the amount of Zn$^{2+}$ and Ni$^{2+}$ ions together is 75 to 99.5 mol % and the amount of metal ions Me is 25 to 0.5 mol %, based in each case on one mole of all metal ions in the metal azo pigment, and
where the molar ratio of Zn$^{2+}$ to Ni$^{2+}$ ions in the metal azo pigment is 90:3 to 3:90, and
b) at least one compound of the formula (II)

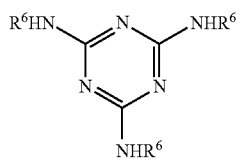

in which R$^6$ is hydrogen or alkyl.

2. The metal azo pigments according to claim 1, wherein:
R$^5$ is hydrogen or C$_1$-C$_4$-alkyl;
R$^6$ is hydrogen, or C$_1$-C$_4$-alkyl, or C$_1$-C$_4$-alkyl mono- or polysubstituted by OH;
the molar ratio of Zn$^{2+}$ to Ni$^{2+}$ ions in the metal are pigment is 80:5 to 5:80: and
the pigment comprises 0.05 to 4 mol of compounds of the formula (II) per mole of structural units of the formula (I).

3. The metal azo pigments according to claim 1, wherein components a) and components b) are present together in the form of adducts.

4. The metal an pigment according to claim 1, wherein:
R$^1$ and R$^2$ are OH,
R$^3$ and R$^4$ are =O,
R$^6$ is hydrogen, and
the molar ratio of Zn$^{2+}$ to Ni$^{2+}$ ions is 60:33 to 33:60.

5. The metal azo pigments according to claim 1, wherein Me is a di- or trivalent metal ion selected from the group consisting of La$^{3+}$, Ce$^{3+}$, Pr$^{3+}$, Nd$^{3+}$, Sm$^{3+}$, Eu$^{3+}$, Gd$^{3+}$, Tb$^{3+}$, Dy$^{3+}$, Ho$^{3+}$, Er$^{3+}$, Tm$^{3+}$ and Yb$^{3+}$, Mg$^{2+}$, Ca$^{2+}$, Sr$^{2+}$, Y$^{3+}$ and Mn$^{2+}$.

6. The metal azo pigments according to claim 1, wherein 0.5 to 2.5 mol of compound of the formula (II) are present per mole of structural units of the formula (I).

7. The metal azo pigments according to claim 1, wherein the pigments have a specific surface area of 50 to 200 m$^2$/g.

8. The metal azo pigments according to claim 1, wherein:
components a) and components b) are present together in the form of adducts;
R$^1$ and R$^2$ are OH;
R$^3$ and R$^4$ are =O;
R$^6$ is hydrogen;
Me is selected from the group consisting of La$^{3+}$, Ce$^{3+}$, Pr$^{3+}$, Nd$^{3+}$, Sm$^{3+}$, Tb$^{3+}$, Ho$^{3+}$ and Sr$^{2+}$;
the molar ratio of Zn$^{2+}$ to Ni$^{2+}$ ions is 60:33 to 33:60;
1.0 to 2.0 mol of compound of the formula (II) are present per mole of structural units of the formula (I); and
the pigment has a specific surface area of 100 to 150 m$^2$/g.

9. A process for producing the metal azo pigments according to claim 1, the process comprising contacting a compound of the formula (III), or tautomers thereof,

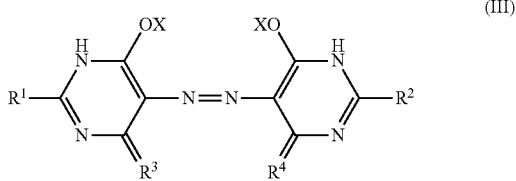

in which
X is an alkali metal ion,
$R^1$ and $R^2$ are each independently OH, $NH_2$ or $NHR^5$,
$R^3$ and $R^4$ are each independently =O or =$NR^5$, and
$R^5$ is hydrogen or alkyl,
with at least one compound of the formula (II)

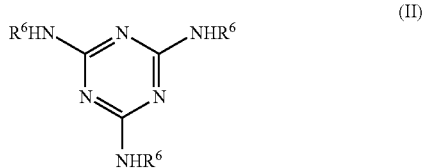

in which $R^6$ is hydrogen or alkyl,
either simultaneously or successively with at least one nickel salt and at least one zinc salt and with at least one further metal salt selected from the group consisting of the $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, $Yb^{3+}$, $Mg^{2+}$, $Ca^{2+}$, $Sr^{2+}$, $Ba^{2+}$, $Sc^{3+}$, $Y^{3+}$, $Ti^{2+}$, $Ti^{3+}$, $Zr^{2+}$, $Zr^{3+}$, $V^{2+}$, $V^{3+}$, $Nb^{3+}$, $Cr^{3+}$, $Mo^{2+}$, $Mo^{3+}$, $Mn^{2+}$, $Cd^{2+}$ and $Pb^{2+}$ salts, where 0.03 to 0.95 mol of at least one nickel salt, 0.03 to 0.95 mol of at least one zinc salt and 0.005 to 0.25 mol of at least one metal salt from the abovementioned group are used per mole of compound of the formula (III), and the sum total of the molar amounts of all the metal salts used is 100 mol %.

10. The process according to claim 9, wherein:
X is a sodium or potassium ion,
$R^5$ is hydrogen or $C_1$-$C_4$-alkyl,
$R^6$ is hydrogen, or $C_1$-$C_4$-alkyl, or $C_1$-$C_4$-alkyl mono- or polysubstituted by OH, and
the at least one further metal salt is selected from the group consisting of $La^{3+}$, $Ce^{3+}$, $Pr^{3+}$, $Nd^{3+}$, $Sm^{3+}$, $Tb^{3+}$, $Ho^{3+}$ and $Sr^{2+}$ salts.

11. Pigment preparations comprising the at least one metal azo pigment according to claim 1 and at least one auxiliary and/or additive.

12. The pigment preparation according to claim 11, wherein the pigment preparation comprises the at least one further pigment, and the at least one further pigment comprises C.I. Pigment Green 36 and/or C.I. Pigment Green 58.

13. A process for producing a pigment preparation comprising the at least one metal azo pigment according to claim 1, the process comprising mixing and/or grinding the at least one metal azo pigment with at least one auxiliary and/or additive selected from the group consisting of surface-active agents, surface-covering agents, bases and solvents, and optionally with at least one further pigment.

14. A colour filter, photoresist, printing ink, or liquid-crystal display comprising one or more metal azo pigments according to claim 1.

15. The colour filter, photoresist, printing ink, or liquid-crystal display of claim 14, wherein the at least one metal azo pigment is a component of a pigment preparation comprising the at least one metal azo pigment, and at least one auxiliary and/or additive selected from the group consisting of surface-active agents, surface-covering agents, bases and solvents, and optionally at least one further pigment.

16. A photoresist comprising one or more metal azo pigments according to claim 1, one or more photocurable monomers, one or more reaction photoinitiators, and optionally one or more binders or dispersants and/or solvents.

17. The photoresist of claim 16, wherein the at least one metal azo pigment is a component of a pigment preparation comprising the at least one metal azo pigment, and at least one auxiliary and/or additive selected from the group consisting of surface-active agents, surface-covering agents, bases and solvents, and optionally at least one further pigment.

18. A process for producing colour filters for liquid-crystal displays, the process comprising a) applying the photoresist according to claim 16 to a substrate, b) exposing the photoresist by means of a photomask, c) curing, and d) developing to provide a finished coloured colour filter.

* * * * *